United States Patent
Then et al.

(10) Patent No.: US 10,770,551 B2
(45) Date of Patent: Sep. 8, 2020

(54) P-I-N DIODE AND CONNECTED GROUP III-N DEVICE AND THEIR METHODS OF FABRICATION

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/322,453

(22) PCT Filed: Sep. 30, 2016

(86) PCT No.: PCT/US2016/055039
§ 371 (c)(1),
(2) Date: Jan. 31, 2019

(87) PCT Pub. No.: WO2018/063408
PCT Pub. Date: Apr. 5, 2018

(65) Prior Publication Data
US 2020/0066849 A1 Feb. 27, 2020

(51) Int. Cl.
*H01L 29/868* (2006.01)
*H01L 29/20* (2006.01)
(Continued)

(52) U.S. Cl.
CPC ........ *H01L 29/2003* (2013.01); *H01L 29/205* (2013.01); *H01L 29/66204* (2013.01); *H01L 29/868* (2013.01)

(58) Field of Classification Search
CPC . H01L 29/868; H01L 29/2003; H01L 29/157; H01L 29/66204
See application file for complete search history.

(56) References Cited

U.S. PATENT DOCUMENTS

2010/0019279 A1  1/2010  Chen et al.
2013/0299841 A1  11/2013 Ranglack et al.
(Continued)

OTHER PUBLICATIONS

International Preliminary Report on Patentability for International Patent Application No. PCT/US2016/055039 dated Apr. 11, 2019, 8 pgs.
(Continued)

*Primary Examiner* — Wael M Fahmy
*Assistant Examiner* — Sarah K Salerno
(74) *Attorney, Agent, or Firm* — Schwabe, Williamson & Wyatt P.C.

(57) ABSTRACT

A P-i-N diode structure includes a group III-N semiconductor material disposed on a substrate. An n-doped raised drain structure is disposed on the group III-N semiconductor material. An intrinsic group III-N semiconductor material is disposed on the n-doped raised drain structure. A p-doped group III-N semiconductor material is disposed on the intrinsic group III-N semiconductor material. A first electrode is connected to the p-doped group III-N semiconductor material. A second electrode is electrically coupled to the n-doped raised drain structure. In an embodiment, a group III-N transistor is electrically coupled to the P-i-N diode. In an embodiment, a group III-N transistor is electrically isolated from the P-i-N diode. In an embodiment, a gate electrode and an n-doped raised drain structure are electrically coupled to the n-doped raised drain structure and the second electrode of the P-i-N diode to form the group III-N transistor.

25 Claims, 20 Drawing Sheets

(51) Int. Cl.
*H01L 29/205* (2006.01)
*H01L 29/66* (2006.01)

(56) References Cited

U.S. PATENT DOCUMENTS

| 2014/0094223 A1 | 4/2014 | Dasgupta et al. |
| 2014/0191249 A1 | 7/2014 | Blanchard et al. |
| 2016/0087160 A1 | 3/2016 | Cheng et al. |

OTHER PUBLICATIONS

International Search Report and Written Opinion for International Patent Application No. PCT/US2016/055039 dated Jun. 29, 2017, 11 pgs.

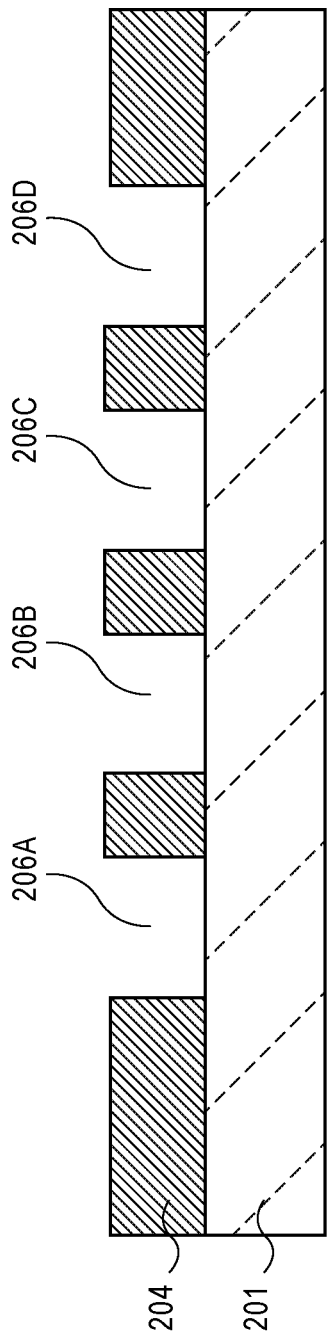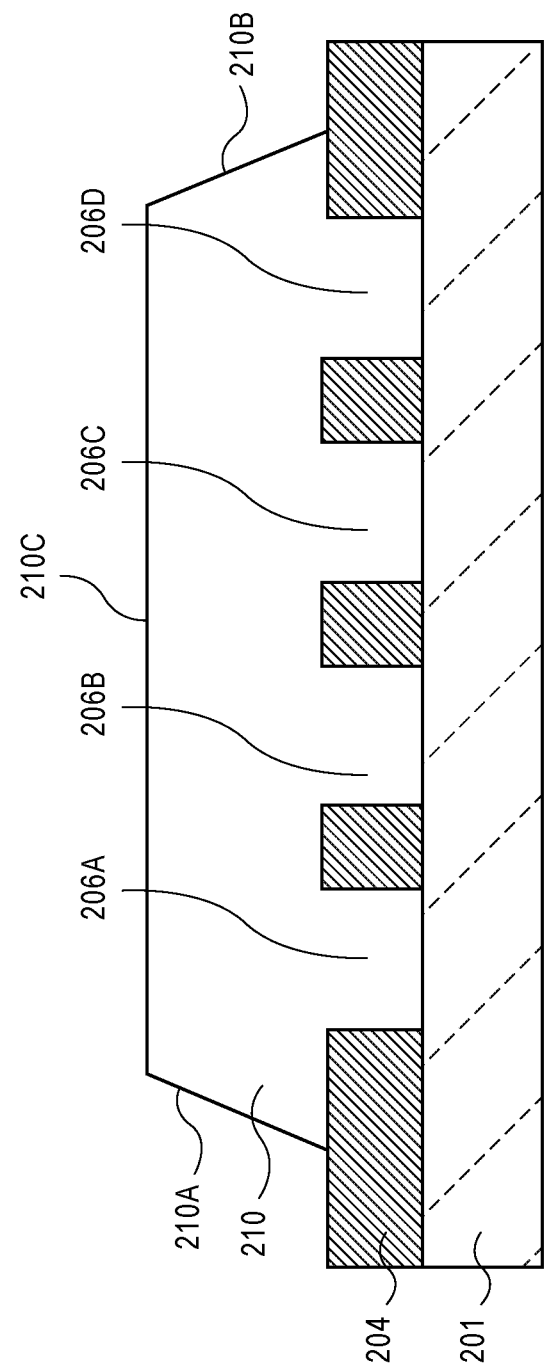

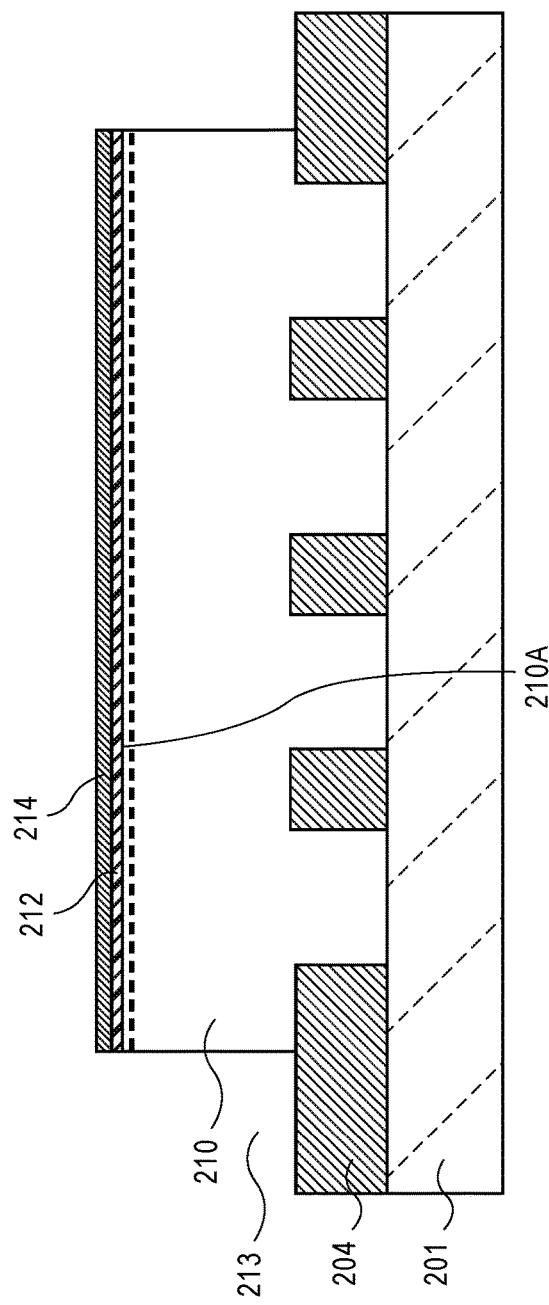

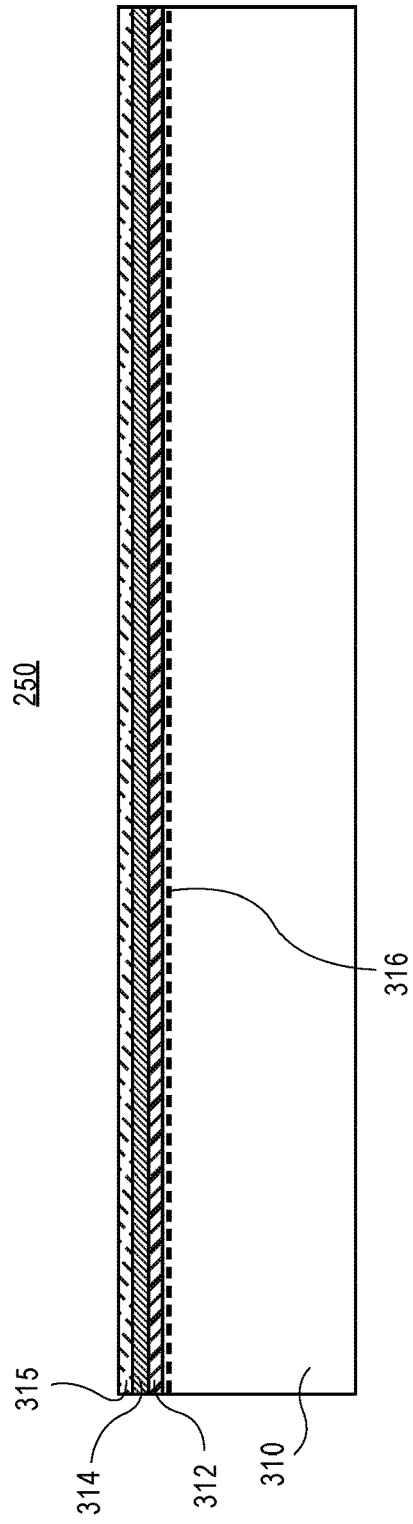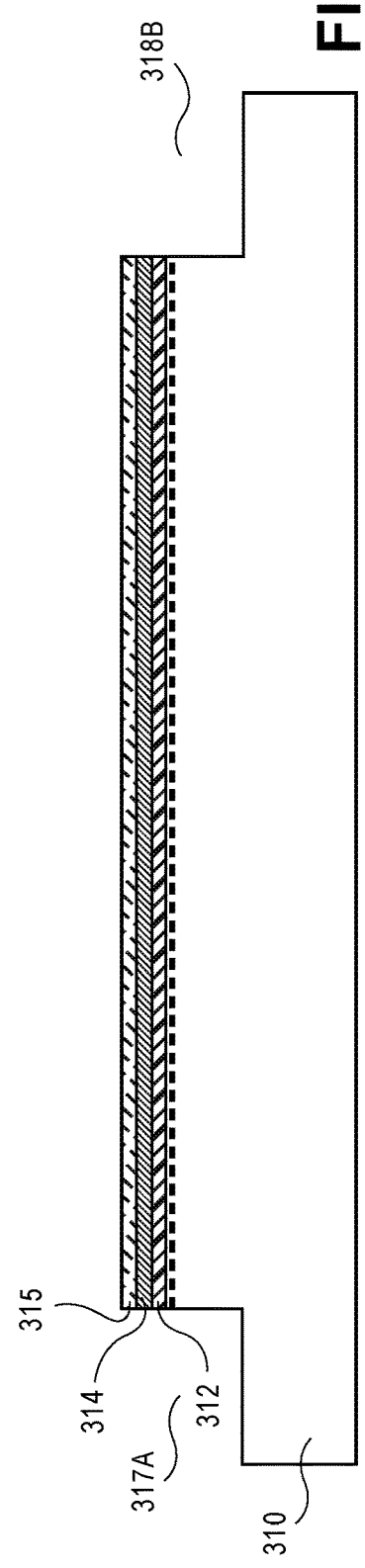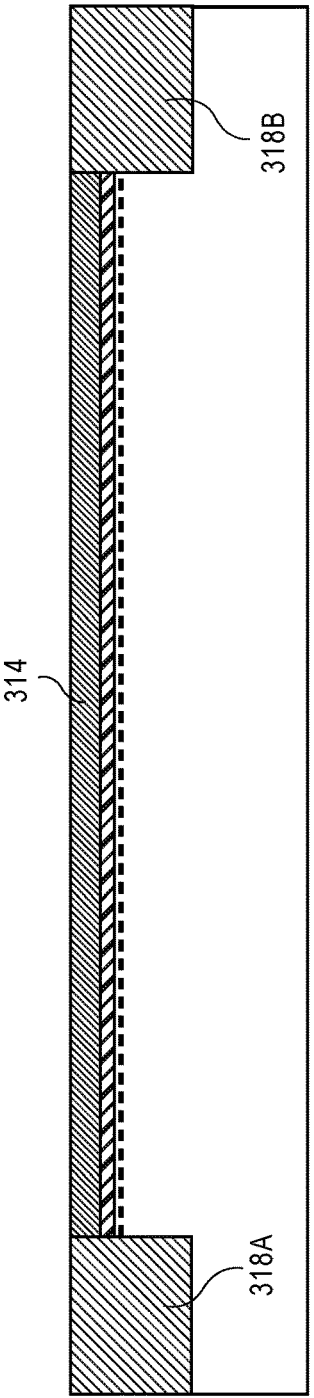

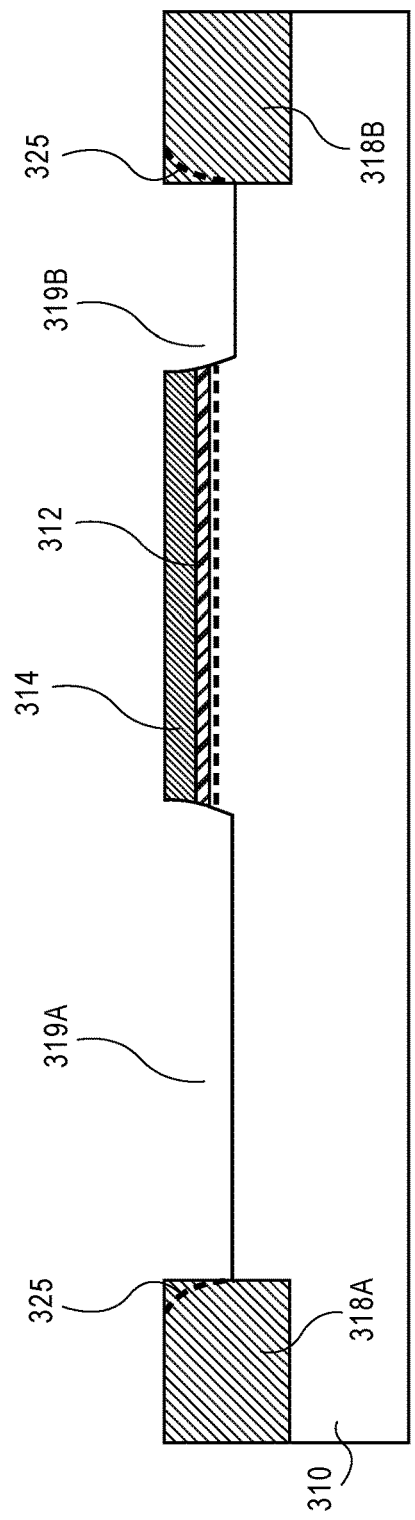
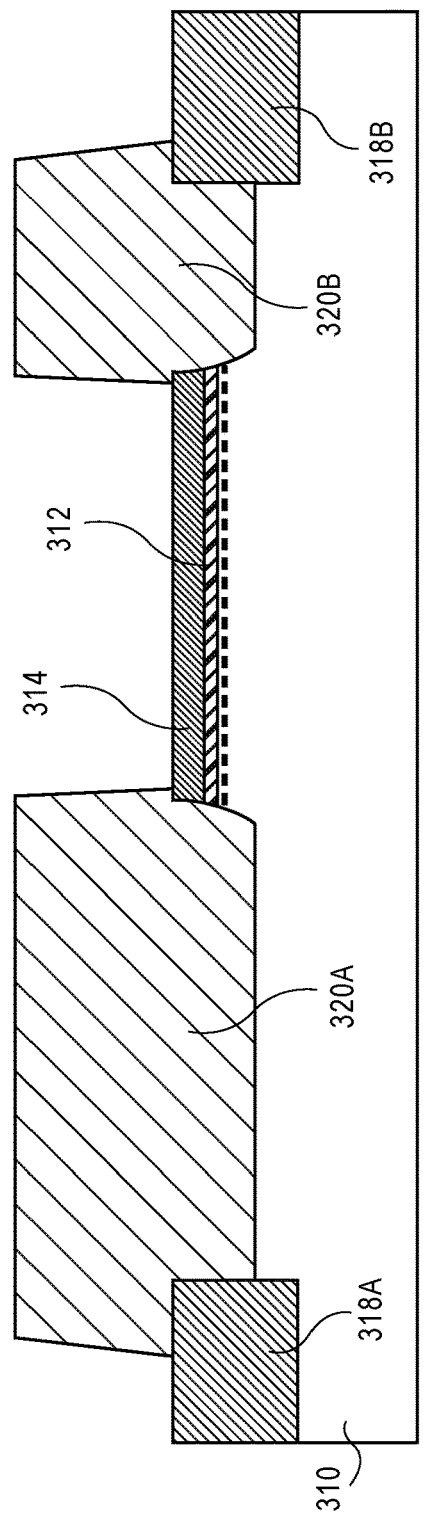

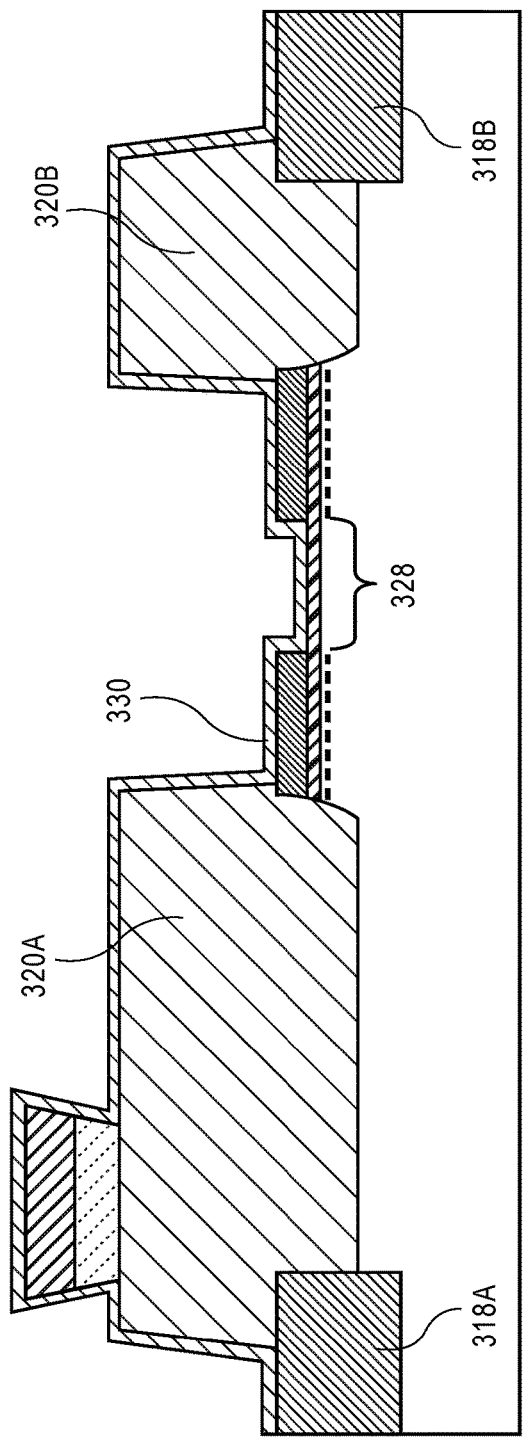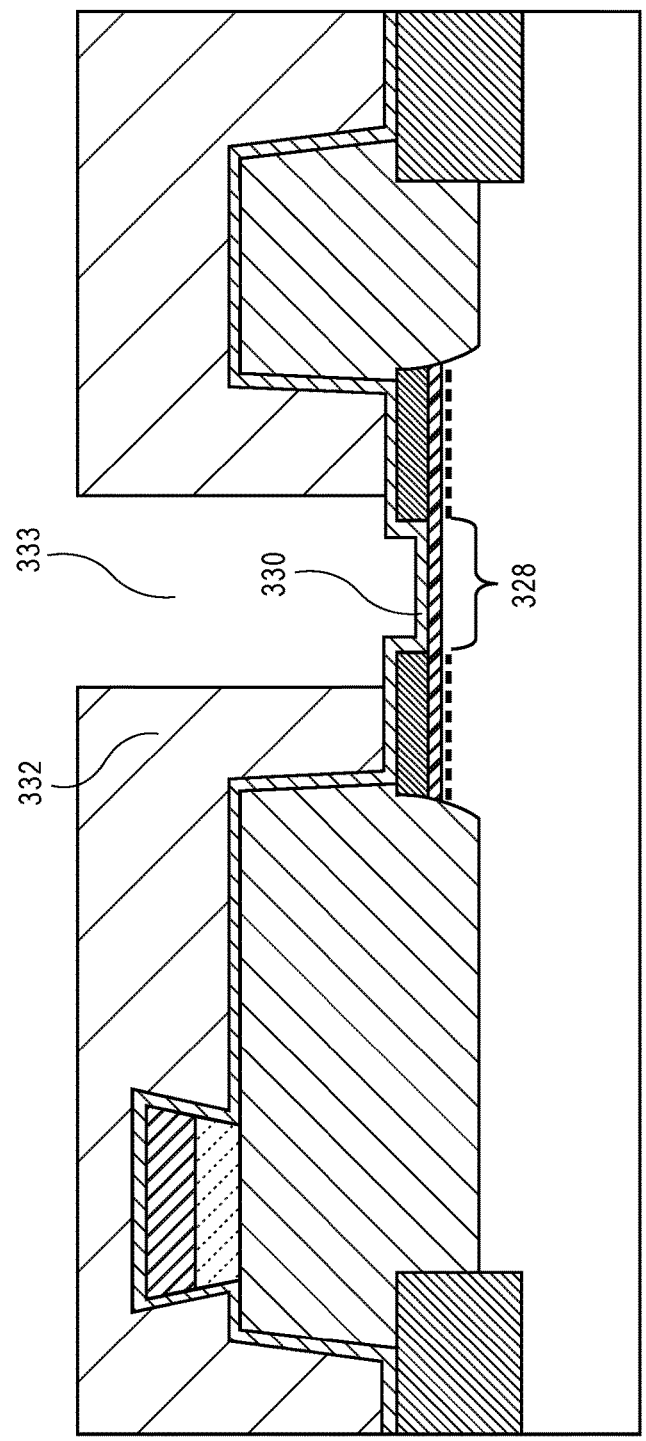

P-I-N DIODE AND CONNECTED GROUP III-N DEVICE AND THEIR METHODS OF FABRICATION

CROSS-REFERENCE TO RELATED APPLICATION

This patent application is a U.S. National Phase Application under 35 U.S.C. § 371 of International Application No. PCT/US2016/055039, filed Sep. 30, 2016, entitled "P-I-N DIODE AND CONNECTED GROUP III-N DEVICE AND THEIR METHODS OF FABRICATION," which designates the United States of America, the entire disclosure of which is hereby incorporated by reference in its entirety and for all purposes.

TECHNICAL FIELD

Embodiments of the present invention generally relate to microelectronic devices and their methods of fabrication, and more particularly to integration of P-i-N diode and group III-N transistor structures and design.

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more diodes in conjunction with one or more transistors, such as one or more field-effect transistors (FETs). Due, in part, to their large bandgap and high mobility, gallium nitride (GaN) and other group III-N semiconductor materials are suited for integrated circuits for applications such as high-frequency and high-power. However, the transistor gates in particular, may be susceptible to damage due to process-induced charging during the manufacturing process, due to electrostatic discharge (ESD) events that occur during packaging and during normal use. Reliable manufacturing processes that produce such integrated circuits may require some form of electrostatic discharge (ESD) protection to prevent component damage. One form of ESD protection can be obtained by fabrication of a diode connected to a transistor or multiple diodes connected to a single or multiple transistors.

BRIEF DESCRIPTION OF THE DRAWINGS

FIGS. 2A-2E illustrate cross-sectional views representing various operations in a method of forming a material layer stack for fabricating a P-i-N diode and a group III-N transistor in accordance with embodiments of the present invention.

FIG. 2A illustrates the formation of a plurality of trenches in a dielectric layer formed above a substrate.

FIG. 2B illustrates the structure of FIG. 2A, following the formation of a group III-N semiconductor material in the plurality of trenches on the substrate.

FIG. 2C illustrates the structure of FIG. 2B following the formation of a mobility enhancement layer on the upper surface of the group III-N semiconductor material, followed by the formation of a polarization charge inducing layer on the mobility enhancement layer.

FIG. 2D illustrates the structure of FIG. 2C, following formation of isolation trenches in a material layer stack including the polarization charge inducing layer, the mobility enhancement layer, and in the group III-N semiconductor material.

FIG. 2E illustrates the structure of FIG. 2D, following the process of forming isolation regions adjacent to the patterned material layer stack.

FIGS. 3A-3O illustrate cross-sectional views representing various operations in a method of fabricating a P-i-N diode structure and a group III-N transistor on a common substrate such as shown in FIG. 2E.

FIG. 3A illustrates a cross sectional view of a material layer stack including a polish stop layer, a polarization charge inducing layer, a mobility enhancement layer and a group III-N semiconductor material.

FIG. 3B illustrates the structure of FIG. 3A, following the formation of isolation trenches.

FIG. 3C illustrates the structure of FIG. 3B, following the formation of isolation regions.

FIG. 3D illustrates the structure of FIG. 3C, following the formation of source and drain trenches in the polarization charge inducing layer, the mobility enhancement layer and the group III-N semiconductor material to form n-doped raised source and n-doped raised drain structures.

FIG. 3E illustrates the structure of FIG. 3D, following the formation of an n-doped raised drain structure and an n-doped raised drain structure.

FIG. 3J illustrates the structure of FIG. 3I, following the deposition of a gate dielectric layer.

FIG. 3K illustrates the structure of FIG. 3J, following the formation of a gate opening in the dielectric layer above the gap.

FIG. 3O illustrates the structure of FIG. 3N, following the formation of a first electrode on the doped group III-N semiconductor material, formation of a second electrode on the n-doped raised drain structure and the formation of a source contact on the n-doped raised source structure to complete formation of a P-i-N diode and a group III-N transistor.

FIG. 4A illustrates the structure of FIG. 3I following the formation of a gate dielectric layer on the mobility enhancement layer in the gate opening and a work function layer on the gate dielectric layer.

FIG. 4B illustrates the formation of a gate electrode on the gate dielectric layer above the gap.

FIG. 4C illustrates the structure of FIG. 4B, following the formation of a first electrode on the doped group III-N semiconductor material, formation of a second electrode on the n-doped raised drain structure and the formation of a source contact on the n-doped raised source structure.

DESCRIPTION OF THE EMBODIMENTS

Figure 1:
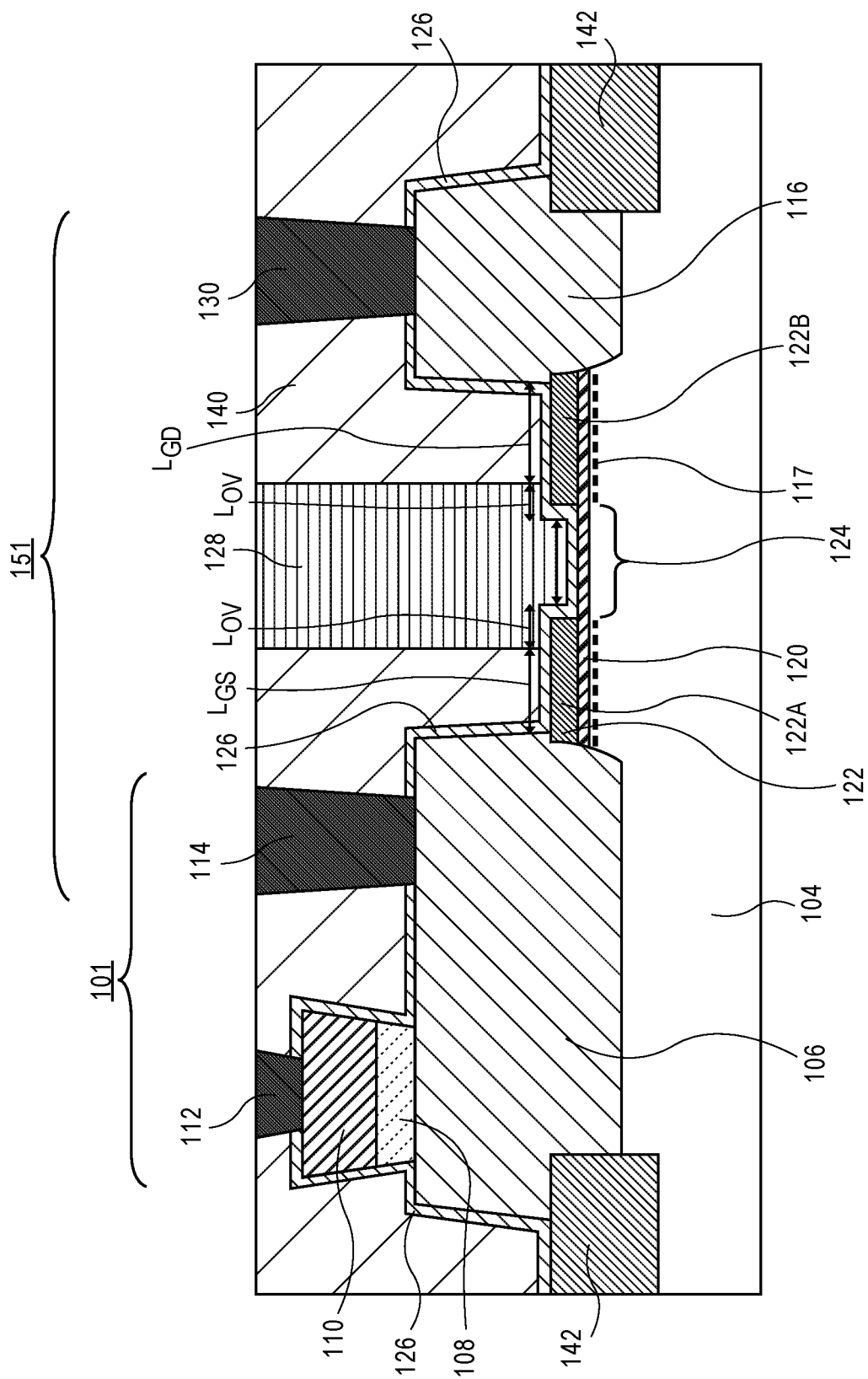
FIG. 1 illustrates a cross-sectional view of a P-i-N diode and a group III-N transistor formed on a group III-N semiconductor material, in accordance with an embodiment of the present invention.

Diodes and group III-nitride (N) transistors for logic, system-on-chip (SoC), radio frequency (RF) components and memory applications and their methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as operations associated with group III-N transistor, are described in lesser detail in order to not unnecessarily obscure embodiments of the present invention. Furthermore, it is to be understood that the various embodiments shown in the Figures are illustrative representations and are not necessarily drawn to scale.

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Electrostatic discharge (ESD) is one of the most prevalent threats to electronic components. In an ESD event, a large amount of charge is transferred during the fabrication process to a component of a microchip (e.g. transistor, capacitor etc.). The ESD event can lead to large amounts of current to pass through the components of a microchip within a very short period of time. Large amounts of uncontrolled current can cause device degradation and in some cases render the device dysfunctional. Thus, designing and integrating structures to protect integrated circuits against ESD events is an important component of the semiconductor device fabrication process. The problem of ESD becomes even greater when the substrate utilized to build the electronic components cannot discharge the extra charge adequately. Floating substrates such as SOI or silicon on insulator are especially prone to destruction caused by ESD events. An intrinsic group III-N semiconductor material may be comparable to SOI substrates because of the ability to withstand high dielectric breakdown. In this regard, an electronic device such as a group III-N transistor fabricated on an intrinsic group III-N semiconductor material may require additional components for protection against ESD events. A semiconductor device such as a P-i-N diode can be readily integrated with transistor circuitry, and may help protect components such as a group III-N transistor. Integration schemes that can fabricate a P-i-N diode on a shared raised drain structure formed on a group III-N semiconductor material substrate can offer ESD protection, enable RF applications, provide significant process advantages and potentially offer cost benefits.

In an embodiment, a P-i-N diode structure includes a group III-N semiconductor material disposed on a substrate. An n-doped raised drain structure is disposed on the group III-N semiconductor material. An intrinsic group III-N semiconductor material is disposed on the n-doped raised drain structure. A p-doped group III-N semiconductor material is disposed on the intrinsic group III-N semiconductor material. A first electrode is connected to the p-doped group III-N semiconductor material and a second electrode is electrically coupled to the n-doped raised drain structure. In an embodiment, the p-doped group III-N semiconductor material is disposed directly on the n-doped raised drain structure to form a PN diode.

In an embodiment, a group III-N transistor is electrically coupled to the P-i-N diode. The transistor includes an n-doped raised source structure, a gate electrode and an n-doped raised drain structure. In an embodiment, the n-doped raised drain structure of the group III-N transistor is shared by the P-i-N diode. In one such embodiment, the n-doped raised drain structure of the group III-N transistor also functions as a cathode of the P-i-N diode. In an embodiment, the first and second electrodes are energized while the gate electrode and the n-doped raised drain structure are electrically isolated (or held at floating potential). In one such embodiment, the P-i-N diode is active while the group III-N transistor is inactive.

FIG. 1 illustrates a cross-sectional view of a P-i-N diode 101 disposed on a group III-N semiconductor material 104 in accordance with an embodiment of the present invention. The P-i-N diode 101 includes an n-doped raised drain structure 106 disposed on the group III-N semiconductor material 104. An intrinsic group III-N semiconductor material 108 is disposed on the n-doped raised drain structure 106. A p-doped group III-N semiconductor material 110 is disposed on the intrinsic group III-N semiconductor material 108. A first electrode 112 is disposed on the p-doped group III-N semiconductor material 104. A second electrode 114 is disposed on the n-doped raised drain structure 106.

In an embodiment, the intrinsic group III-N semiconductor material 108 in the P-i-N diode 101 leads to higher diode turn on voltage, lower off state leakage current and higher breakdown voltage. In an alternative embodiment, there is no intrinsic group III-N semiconductor material 108 and the p-doped group III-N semiconductor material 110 is disposed directly on the n-doped raised drain structure 106. In one such embodiment, the resulting PN diode has a lower turn on voltage and lower on state resistance compared to the P-i-N diode.

In an embodiment, a group III-N transistor 151 is disposed on the group III-N semiconductor material 104. An n-doped raised source structure is disposed on the group III-N semiconductor material 104. A mobility enhancement layer 120 is disposed on the group III-N semiconductor material 104 between the n-doped raised source structure 116 and the n-doped raised source structure 116 of the P-i-N diode. A polarization charge inducing layer 122 is disposed on the mobility enhancement layer 120. The polarization charge inducing layer 122 has a first portion 122A and a second portion 122B that are separated by a gap 124. A gate dielectric layer 126 is disposed on the mobility enhancement layer 120 in the gap 124. A gate electrode 128 is disposed on the gate dielectric layer 126 above the gap 124 and between the n-doped raised drain structure 106 and the n-doped raised source structure 116. A source contact 130 is disposed on the n-doped raised source structure 116.

In an embodiment, the gate dielectric layer 126 is disposed on the first portion 122A and second portion 122B of the polarization charge inducing layer 122 as illustrated in FIG. 1. In an embodiment, gate dielectric layer 126 is also disposed on the sloped sidewalls and on the uppermost surface of the n-doped raised source structure 116. In an embodiment, the gate dielectric layer 126 is disposed on the sloped sidewalls and on the uppermost surface of the n-doped raised drain structure 106 as shown in FIG. 1. In embodiment, the gate dielectric layer 126 is disposed in an opening in the dielectric layer 140 above the gap 124 and not on the first portion 122A and second portion 122B of the polarization charge inducing layer 122 or on the n-doped raised drain structure 106 or on the n-doped raised source structure 116.

In an embodiment, the polarization charge inducing layer 122 introduces a polarization difference in the top surface of the group III-N semiconductor material 104 creating a conducting sheet of charge known as a 2 dimensional electron gas (2DEG—represented by dashed lines 117) in the group III-N semiconductor material 104. The gap 124 in the polarization charge inducing layer 122 leads to an absence of 2DEG beneath the gap 124 in the group III-N semiconductor material 104. When positive bias voltage, greater or equal to the threshold voltage, VT, is applied on the gate electrode 128, a channel is formed in the group III-N semiconductor material 104 below the gap 124, and current flows from the n-doped raised drain structure 106 to the n-doped raised source structure 116.

In an embodiment, the group III-N transistor 101 has a gate electrode 128 with portions that extend on opposite sides of the gap 124 by a distance $L_{OV}$. In one such embodiment, the gate electrode 128 overlaps with the polarization charge inducing layer 122. In an embodiment, the overlap distance $L_{OV}$, leads to stray gate capacitance. In an embodiment, an overlap of less than 10 nm can limit the stray gate capacitance to below 10%. The gate electrode 128 is distant from the n-doped raised drain structure 106 by a distance $L_{GD}$, denoted as a gate to drain separation distance. The gate electrode 128 is separated from the n-doped raised source structure 116 by a distance $L_{GS}$, denoted as a gate to source separation distance. In an embodiment, the distances $L_{GD}$ and $L_{GS}$ are of equal lengths as illustrated in FIG. 1. In other embodiments, the distance $L_{GS}$ is less than the distance $L_{GD}$. The distance $L_{GD}$, influences the breakdown voltage, $V_{BD}$ between the gate electrode 128 and the n-doped raised drain structure 106. In an embodiment, an $L_{GD}$ of at least 100 nm enables the group III-N transistor 151 to have a breakdown voltage that is greater than 8V.

In an embodiment, n-doped raised drain structure 106 and the n-doped raised source structure 116 have uppermost surfaces that are above the level of the polarization charge inducing layer 122 and an isolation region 142 as illustrated in FIG. 1. In an embodiment, the n-doped raised drain structure 106 and n-doped raised source structure 116 include an n-doped group III-N semiconductor material such as but not limited to an n-doped GaN or n-doped $In_xGa_{1-x}N$, where x is between 0.01 and 0.1. In one such embodiment, the n-doped $In_xGa_{1-x}N$ is n-doped $In_{0.1}Ga_{0.9}N$. In an embodiment, the n-doped $In_xGa_{1-x}N$ is doped with an n-type dopant such as Si or Ge having a dopant density that is at least $1e19/cm^3$.

In an embodiment, the intrinsic group III-N semiconductor material 108 includes a group III-N semiconductor material such as but not limited to GaN or $In_xGa_{1-x}N$, where x is between 0.1 and 0.2. In an embodiment, an intrinsic $In_xGa_{1-x}N$ is intrinsic-$In_{0.2}Ga_{0.8}N$. In an embodiment, the indium concentration of the intrinsic group III-N semiconductor material 108 is greater than the indium concentration of the n-doped raised drain structure 106 to enable a lower bandgap in the intrinsic group III-N semiconductor material 108 than in the n-doped raised drain structure 106. In an embodiment, a lower bandgap in the intrinsic group III-N semiconductor material 108 as compared to the bandgap of the n-doped raised drain structure 106 enables P-i-N diode to be turned on at voltages less than 3 V. In an embodiment, the thickness of the intrinsic group III-N semiconductor layer 323 ranges from 5 nm-10 nm.

In an embodiment, the p-doped group III-N semiconductor material 110 includes a material such as a p-doped GaN, having a bandgap that higher than the bandgap of the intrinsic group III-N semiconductor material 108. In an embodiment, the p-type dopant includes a species such as magnesium (Mg). In an embodiment, the p-type dopant has a dopant density that is at least $1e17/cm^3$. In one embodiment, the p-doped group III-N semiconductor material 324 is a Mg-doped GaN having a magnesium dopant density that is at least $1e17/cm^3$. In an embodiment, the thickness of the p-doped group III-N semiconductor material ranges from 40 nm-200 nm.

In an embodiment, the gate electrode 128 includes a work function layer such as but not limited to Pt, Ni, TiN or TaN. In an embodiment, the gate electrode 128 includes a gate cap metal on the work function layer. In one such embodiment, the gate cap metal is tungsten. In an embodiment, when the gate electrode 128 includes a work function layer and a gate cap metal, the work function layer has a thickness that is at least 20 nm.

In an embodiment, the gate dielectric layer 126 includes a gate dielectric material such as but not limited to $Al_2O_3$, $HfO_2$, $ZrO_2$, TiSiO, HfSiO or $Si_3N_4$. In an embodiment, the gate dielectric layer 126 has a thickness that is approximately in the range of 2 nm-10 nm. In an embodiment, the gate dielectric layer 126 is a composite stack including two separate and distinct layers of gate dielectric materials chosen from the above group of gate dielectric materials. In one such embodiment, a layer of gate dielectric material of one type is disposed on a layer of gate dielectric material of a different type to form the composite stack.

In an embodiment, the group III-N semiconductor material 104 is a GaN layer. In one such embodiment, the group III-N semiconductor material 104 has a relatively high carrier mobility, (greater than 500 $cm^2 V^{-1}$). In one such embodiment, the group III-N semiconductor material 104 is a substantially undoped group III-nitride material (i.e., $O_2$ impurity concentration minimized) for minimal impurity scattering. In other embodiments, group III-N semiconductor material 104 includes one or more ternary alloys of GaN, such as AlGaN, InGaN, AlInN, or a quaternary alloy of GaN including at least one group III element and nitrogen, such as $In_xAl_yGa_{1-x-y}N$, where x ranges from 0.01-0.1 and y ranges from 0.01-0.1. In an embodiment, the group III-N semiconductor material 104 has a material thickness in the range of 100 nm-5 um.

In an embodiment, the mobility enhancement layer 120 includes a group III-N semiconductor material such as but not limited to AlN, InAlN or AlGaN. In an embodiment, the mobility enhancement layer 120 has an insufficient thickness to introduce 2DEG in the group III-N semiconductor material 104. In an embodiment, the mobility enhancement layer 120 has a thickness that is less than 1 nm to prevent the introduction of polarization difference on the underlying group III-N semiconductor material 104. In an embodiment, the mobility enhancement layer 120 and the underlying group III-N semiconductor material 104 are chosen to be binary alloys in order to reduce alloy scattering in the uppermost portion of the group III-N semiconductor material 104.

In an embodiment, the mobility enhancement layer 120 has a bandgap that is greater than the bandgap of the group III-N semiconductor material 104. In one such embodiment, a quantum well is formed below the interface between the mobility enhancement layer 120 and the group III-N semiconductor material 104. In an embodiment, the mobility enhancement layer 120 is an AlN layer and the underlying group III-N semiconductor material 104 is GaN. In one such embodiment, the presence of the quantum well and reduced alloy scattering enhances electron mobility in the GaN group III-N semiconductor material 104.

In an embodiment, the polarization charge inducing layer 122 includes a material capable of inducing a polarization difference in the uppermost portion of the group III-N semiconductor material 104, such as but not limited to $Al_xGa_{1-z}N$, $Al_wIn_{1-w}N$, or AlN, where Z ranges from 0.2-0.3 and W ranges from 0.7-0.85. In an embodiment, the polarization charge inducing layer 122 has a thickness greater than a minimum thickness needed to induce a sufficient polarization difference to create 2DEG effect in the uppermost portion of the group III-N semiconductor material 104. In one such embodiment, the polarization charge inducing layer 122 has a thickness that is approximately in the range of 3-20 nm. In an embodiment, the polarization charge inducing layer 122 is AlGaN and the group III-N semiconductor material 104 is GaN. In one such embodiment, the AlGaN polarization charge inducing layer 122 has a thickness that is approximately in the range of 3 nm-5 nm. In an embodiment, the mobility enhancement layer 120 is AlN, the polarization charge inducing layer 122 is AlGaN and the group III-N semiconductor material 104 is GaN. In one such embodiment, the AlN mobility enhancement layer 120 has a thickness that is in the range of 0.8 nm-1.2 nm and the AlGaN polarization charge inducing layer 122 has a thickness that is in the range of 3 nm-5 nm.

In an embodiment, the first metal electrode 112, the second metal electrode 114, and the source contact 130, include metals such as but not limited to Ni, Ti, Pt or W. In one embodiment, the first metal electrode 112, the second metal electrode 114, and the source contact 130, includes a metal layer including one of the above metals and a conductive cap. In one such embodiment, the conductive cap includes a conductive metal such tungsten or a conductive alloy such as TiN.

In an embodiment, isolation region 142 includes a dielectric material such as but not limited to silicon oxide, silicon oxynitride, or carbon doped oxide.

FIGS. 2A-2E illustrate cross-sectional views representing various operations in a method of forming a material layer stack for fabricating a P-i-N diode structure and/or a group III-N transistor structure in accordance with embodiments of the present invention.

FIG. 2A illustrates the formation of a plurality of openings 206A, 206B, 206C and 206D in a dielectric layer 204 formed above a substrate 201. In an embodiment, the plurality of openings 206A, 206B, 206C and 206D are formed by a plasma etch process. In an embodiment, the plurality of openings 206A, 206B, 206C and 206D provide a location where a subsequent group III-N material will be formed.

In an embodiment, the substrate 201 includes a semiconductor material such as but not limited to silicon, silicon germanium (SiGe) or silicon carbide (SiC). In an embodiment, dielectric layer 204 includes materials such as, but not limited to silicon dioxide ($SiO_2$), carbon doped oxide (CDO), silicon nitride. In an embodiment, dielectric layer 204 is formed using a deposition technique such as but not limited to plasma enhanced chemical vapor deposition (PECVD), chemical vapor deposition (CVD) or vertical diffusion furnace (VDF). In an embodiment, dielectric layer 204 has a thickness in the range of 50 nm-200 nm and each of the plurality of openings 206A, 206B, 206C and 206D have a width that is at least 100 nm.

FIG. 2B illustrates the structure of FIG. 2A, following the formation of a group III-N semiconductor material 210 in the plurality of openings 206A, 206B, 206C and 206D and on uppermost surfaces of the dielectric layer 204. In an embodiment, the group III-N semiconductor material 210 is grown by a MOCVD process at a temperature in the range of 900-1050 degrees Celsius. The MOCVD process fills the plurality of openings 206A, 206B, 206C and 206D with the group III-N semiconductor material 210. The group III-N semiconductor material 210 also grows over the uppermost surfaces of the dielectric layer 204, a process known as lateral epitaxial overgrowth (LEO). In an embodiment, the group III-N semiconductor material 210 is grown to have sidewalls 210A and 210B that are sloped, and an uppermost surface 210C that is substantially flat. In an embodiment, the group III-N semiconductor material 210 has a material composition such as is described above in association with group III-N semiconductor material 110. In an embodiment, the group III-N semiconductor material 210 is a GaN layer. In one such an embodiment, the sloped sidewalls of the GaN group III-N semiconductor material 210A and 210B have a semipolar crystal plane (11-22) and the uppermost surface of the GaN layer 210C has a (110-1) orientation. In one such embodiment, a group III-N transistor is formed on the uppermost surface 210C having a (110-1) crystal plane orientation. In an embodiment, the GaN group III-N semiconductor material 210 is grown to a thickness that is approximately in the range of 100 nm to 5 micrometers. In an embodiment, group III-N semiconductor material 210 has a defect density less than (1e10/cm2).

Figure 2C:
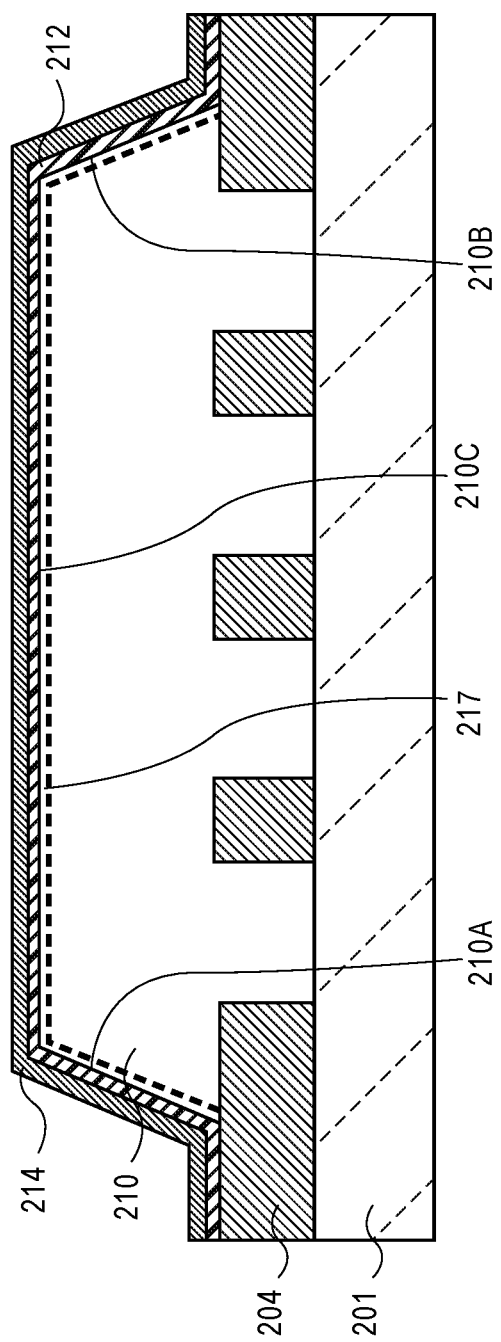

FIG. 2C illustrates the structure of FIG. 2B following the formation of a mobility enhancement layer 212 on the upper surface of the group III-N semiconductor material 210, followed by the formation of a polarization charge inducing layer 214 on the mobility enhancement layer 212. In an embodiment, the mobility enhancement layer is formed by a MOCVD process. In an embodiment, the mobility enhancement layer 212 is grown by a MOCVD process at a temperature in the range of 900-1050 degrees Celsius. In an embodiment, the MOCVD growth process leads to conformal growth of the mobility enhancement layer 212 on the sloped sidewalls 210A and 210B and on the uppermost surface 210C of the group III-N semiconductor material 210. In an embodiment, the mobility enhancement layer 212 is grown to have a thickness that is insufficient to induce polarization difference on the underlying group III-N semiconductor material 210. In an embodiment, the mobility enhancement layer 212 has a thickness that is approximately 1 nm or less. In other embodiments, the MOCVD growth condition does not result in a conformal growth of the mobility enhancement layer 212. In one such embodiment, the MOCVD growth process leads to a mobility enhancement layer 212 having a thickness that is approximately 1 nm on the uppermost surface 210C of the group III-N semiconductor material 210 and a thickness that is in the range of 0 Angstroms-4 Angstroms on the sidewalls 210A and 210B of the group III-N semiconductor material 210. In an embodiment, the mobility enhancement layer includes a material such as but not limited to AlN, InAlN or AlGaN. In an embodiment, the mobility enhancement layer 212 is AlN. In an embodiment, the mobility enhancement layer 212 is AlN and has a thickness on the uppermost surface 210C of the group III-N semiconductor material 210, that is less than or equal to 1 nm.

In an embodiment, the polarization charge inducing layer 214 is formed on the mobility enhancement layer 212. The polarization charge inducing layer 214 has sloped sidewalls. In an embodiment, polarization charge inducing layer 214 is formed using a metal organic chemical vapor deposition MOCVD process. In an embodiment, the polarization charge inducing layer 214 is grown by a MOCVD process at a temperature in the range of 900-1050 degrees Celsius. In an embodiment, the MOCVD growth process leads to conformal growth of the polarization charge inducing layer 214 on the mobility enhancement layer 212. In an embodiment, the polarization charge inducing layer 214 includes a material such as but not limited to AlN, AlInN or $Al_yGa_{1-y}N$ (where y is 0.24-0.36) and the group III-N semiconductor material includes a material such as but not limited to InGaN or GaN. In an embodiment, the polarization charge inducing layer has a thickness that ranges from 3 nm-20 nm. In an embodiment, the polarization charge inducing layer 214 is AlInN. In an embodiment, the polarization charge inducing layer 214 is AlInN and has a thickness that ranges from 3 nm-10 nm. In an embodiment, the presence of a polarization charge inducing layer 214 induces polarization difference in the group III-N semiconductor material. The polarization difference is induced below the surface of mobility enhancement layer 212 in uppermost portion of the group III-N semiconductor material 210. The presence of sufficient polarization difference induces 2DEG (represented by dashed lines 217) in the uppermost portion of the group III-N semiconductor material 210. In an embodiment, the group III-N semiconductor material 210, the mobility enhancement layer 212 and the polarization charge inducing layer 214 are sequentially grown in a single process introduction in an MOCVD growth chamber without breaking vacuum.

FIG. 2D illustrates the structure of FIG. 2C, following the formation of isolation trench 213 in a material layer stack including the polarization charge inducing layer 214, the mobility enhancement layer 212 and the group III-N semiconductor material 210. In an embodiment, a mask is formed (not shown) on the polarization charge inducing layer 214 in the structure of FIG. 2C. The mask covers the uppermost portion of the polarization charge inducing layer 214 and exposes sidewall portions of the polarization charge inducing layer 214 and the isolation layer 204. In an embodiment, isolation trenches 213 are formed by a plasma etch process. In an embodiment, the plasma etch process utilizes process gases such as but not limited to SF6, $BCl_3$, $Cl_2$, $Br_2$ or Ar. In an embodiment, subsequent to the completion of etch, the masking layer is removed.

FIG. 2E illustrates the structure of FIG. 2D, following the formation of a second isolation regions 216 adjacent to the patterned group III-N semiconductor material. In an embodiment, a polish stop layer 215 is blanket deposited on the uppermost surface and on sidewalls of the patterned polarization charge inducing layer 214, on sidewalls of the mobility enhancement layer 212 and on sidewalls of the group III-N semiconductor material 210 and on an uppermost surface of the dielectric layer 204. In an embodiment, the polish stop layer is deposited using a PECVD process. In an embodiment, the polish stop layer 215 includes a dielectric material such as but not limited to silicon nitride, carbon doped silicon nitride or silicon oxynitride. In an embodiment, the polish stop layer has a thickness that is approximately in the range of 5 nm-10 nm. A dielectric layer 216, is blanket deposited on the polish stop layer 215 and in the trench 213, and filling the trench 213. In an embodiment, the dielectric layer 216 is polished back leading to formation of a second isolation region 216.

In an embodiment, a region 250 illustrates a material layer stack for fabrication of the P-i-N diode 101 and the group III-N transistor 151 as illustrated in FIG. 2E. The material layer stack includes the polish stop layer 215, the polarization charge inducing layer 214, the mobility enhancement layer 212, and the group III-N semiconductor material 210.

Figure 3F:
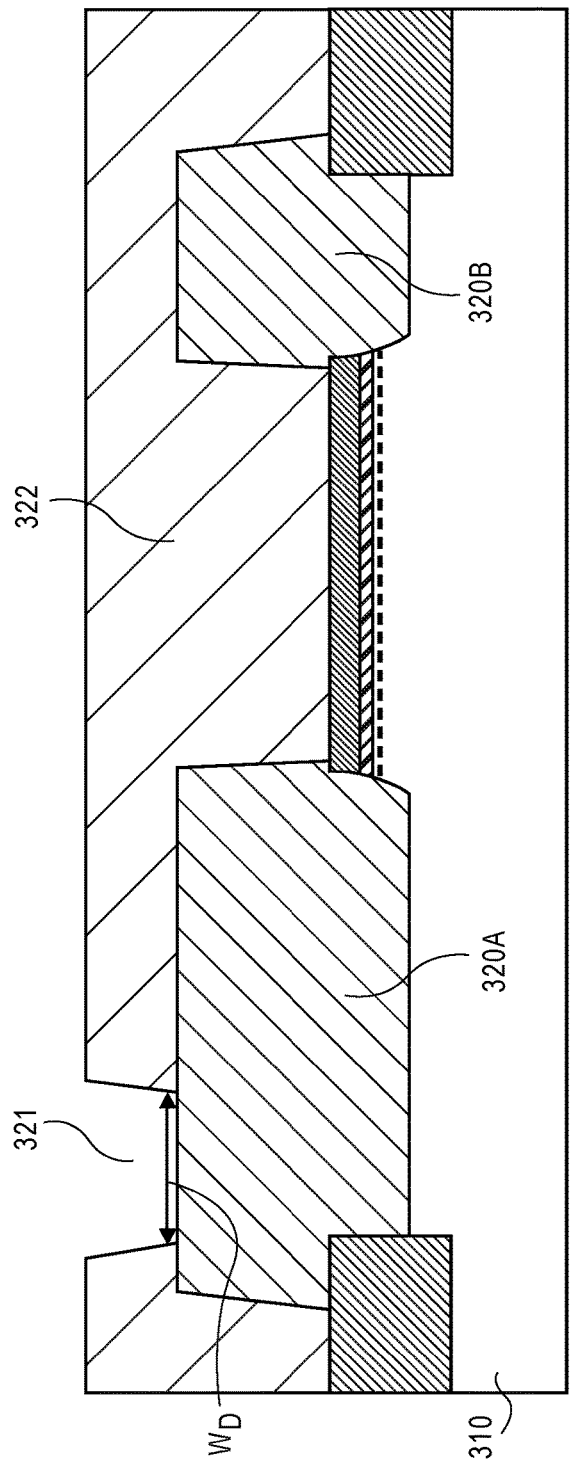
FIG. 3F illustrates the structure of FIG. 3E, following the formation of a diode opening in a dielectric layer to expose an uppermost surface of the n-doped raised drain structure.
Figure 3G:
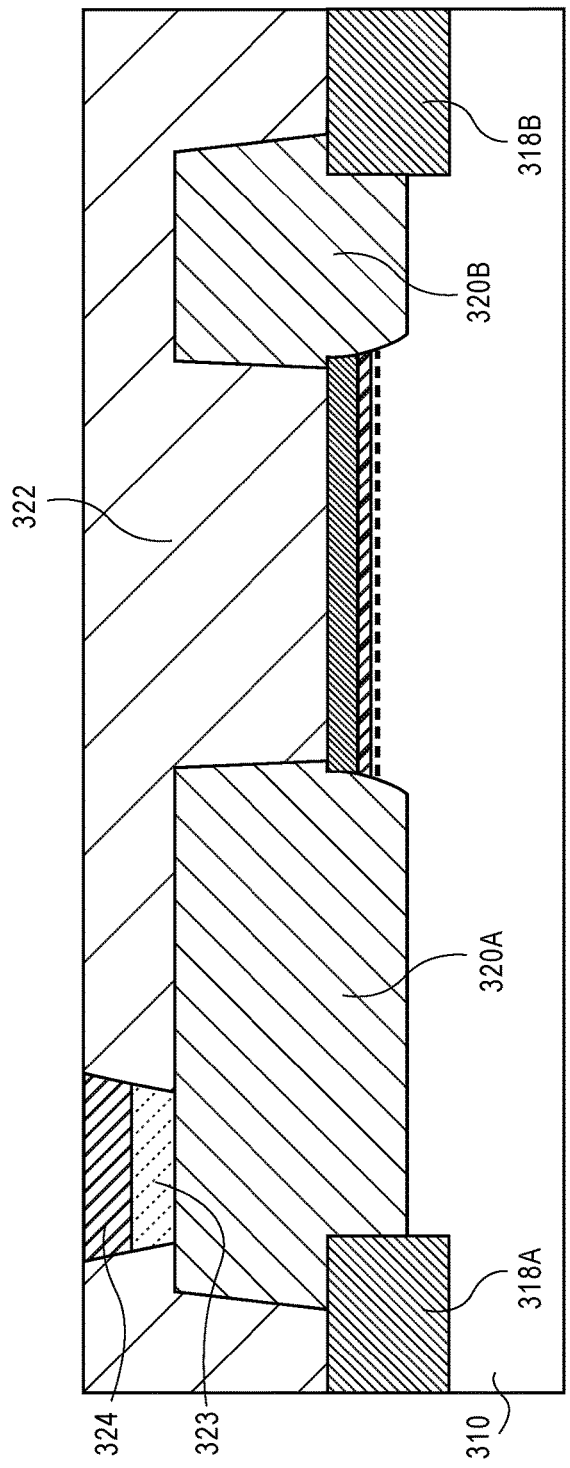
FIG. 3G illustrates the structure of FIG. 3F, following the formation of an intrinsic group III-N semiconductor layer on the n-doped raised drain structure and a p-doped group III-N semiconductor material on the intrinsic group III-N semiconductor layer.
Figure 3H:
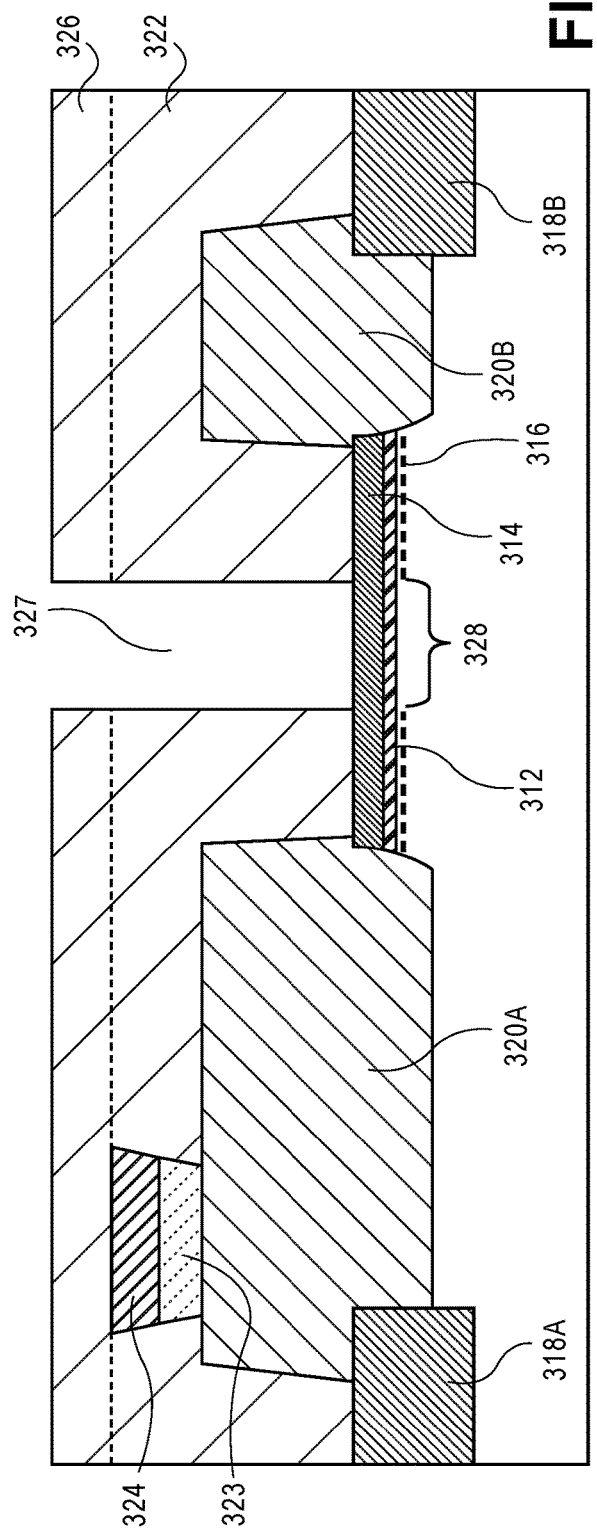
FIG. 3H illustrates the structure of FIG. 3G, following the formation of an opening in the dielectric layer to expose a portion of the polarization charge inducing layer.
Figure 3I:
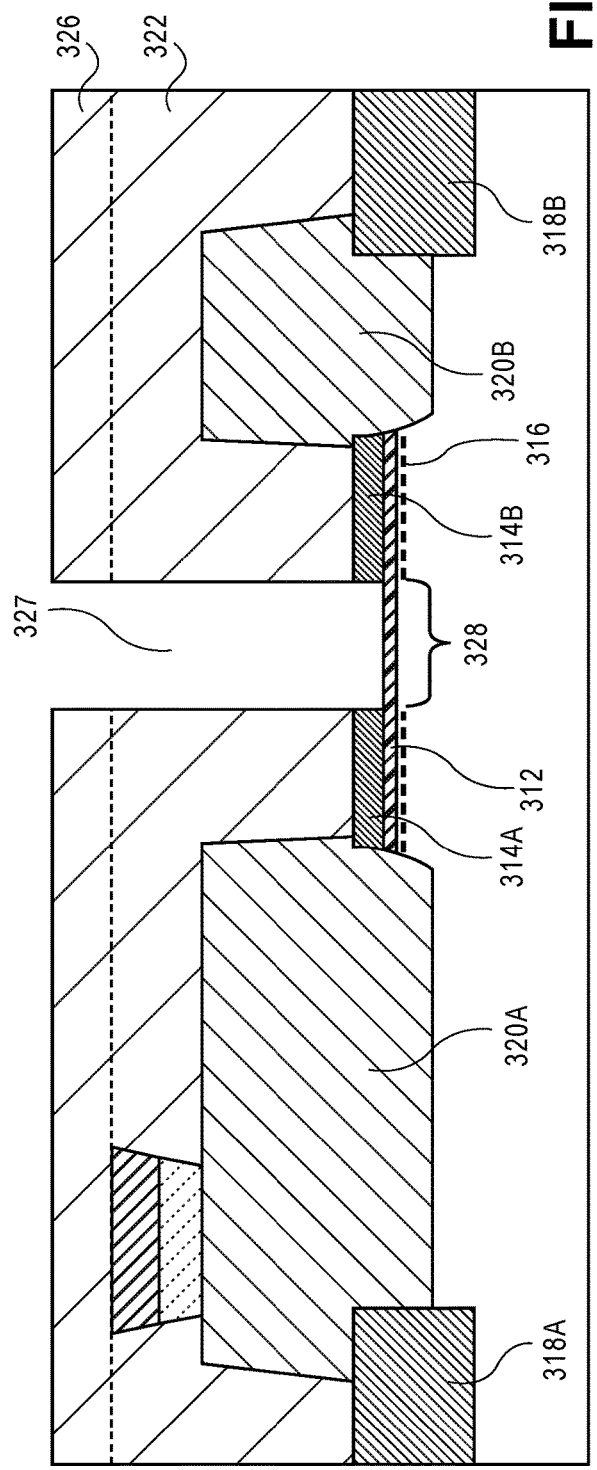
FIG. 3I illustrates the structure of FIG. 3H, following the formation of a gap in the portion in the polarization charge inducing layer.
Figure 3L:
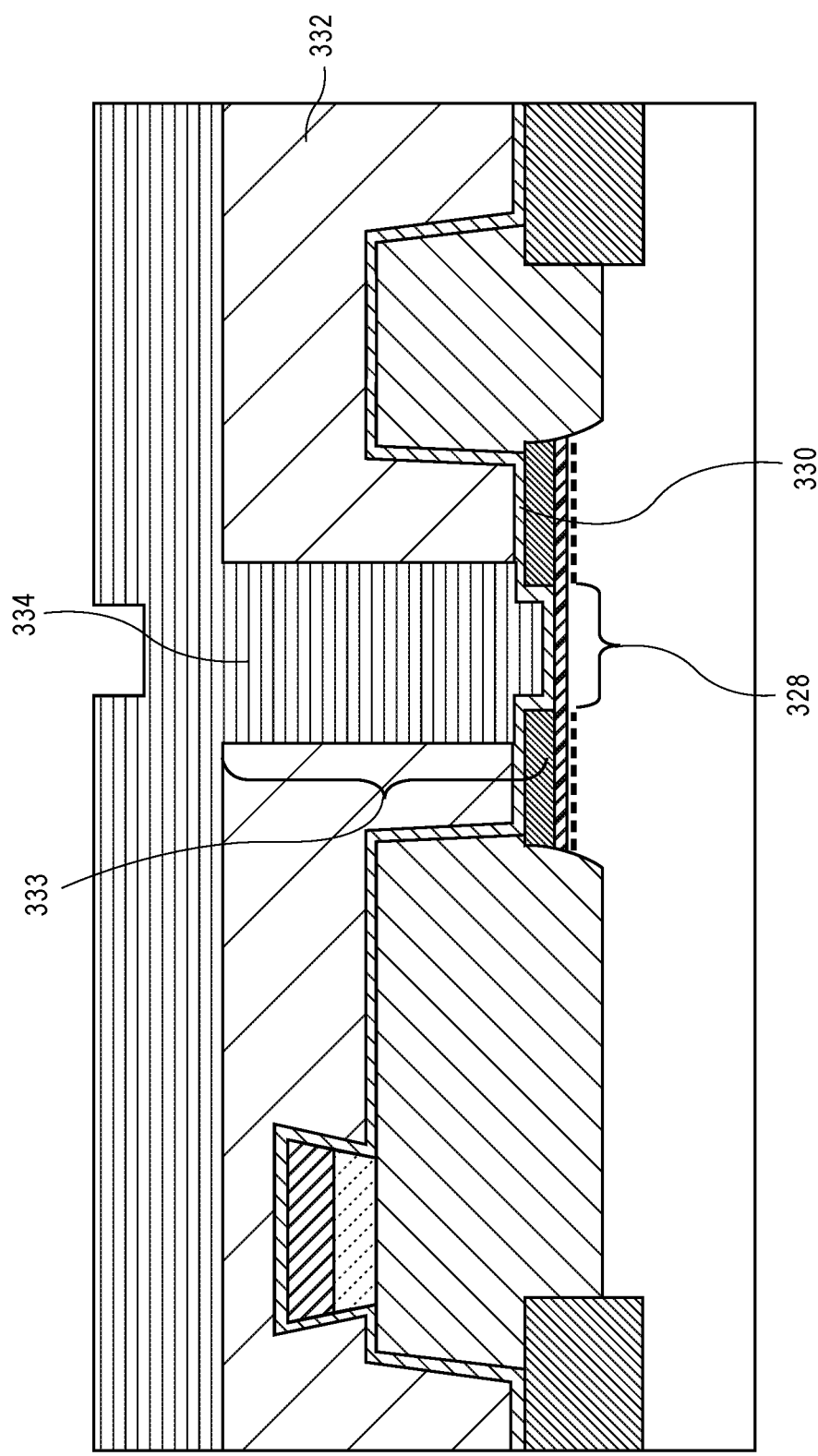
FIG. 3L illustrates the structure of FIG. 3K following the formation of a gate electrode layer on the gate dielectric layer in the gate opening.
Figure 3M:
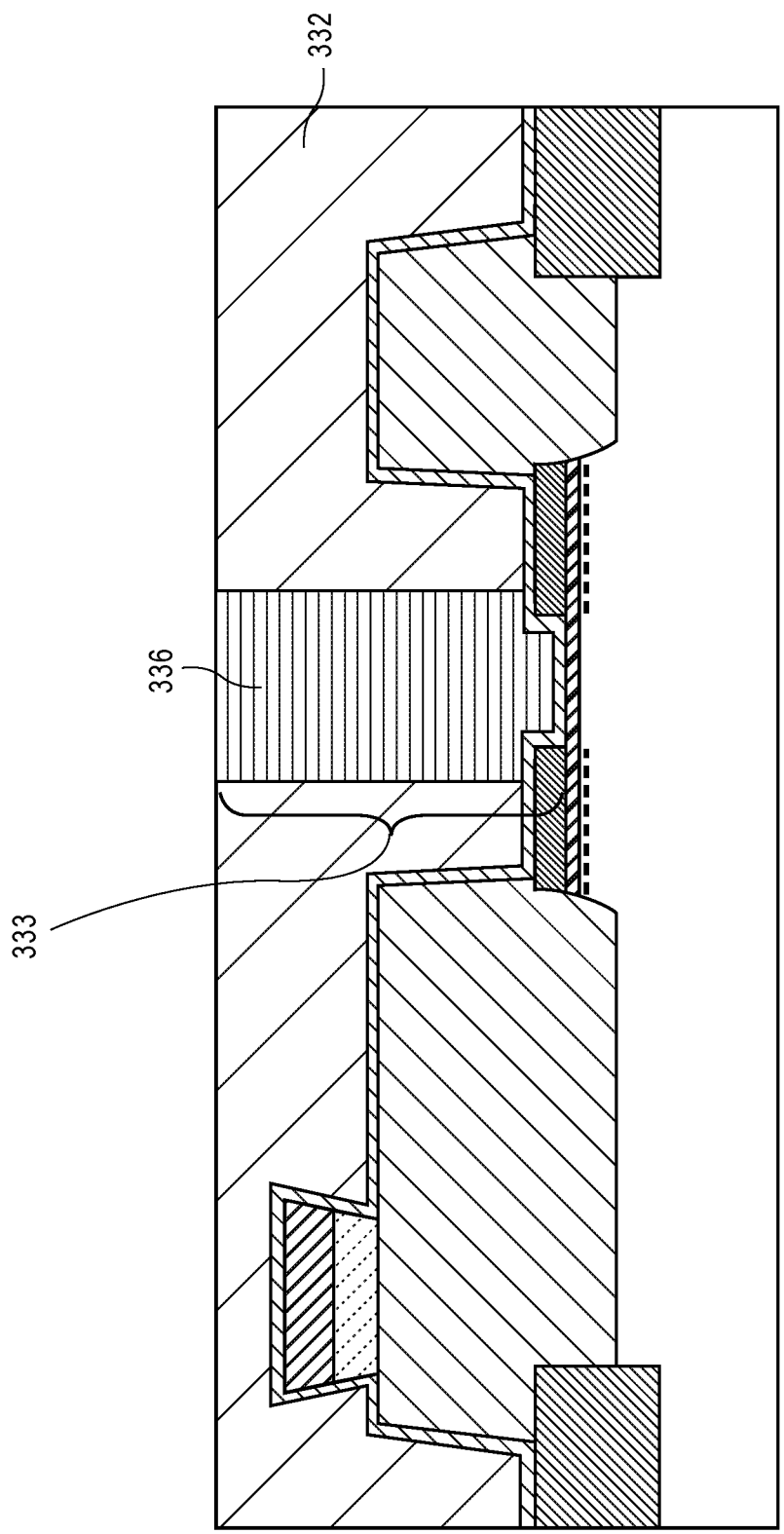
FIG. 3M illustrates the structure of FIG. 3L following the formation of a gate electrode 336.
Figure 3N:
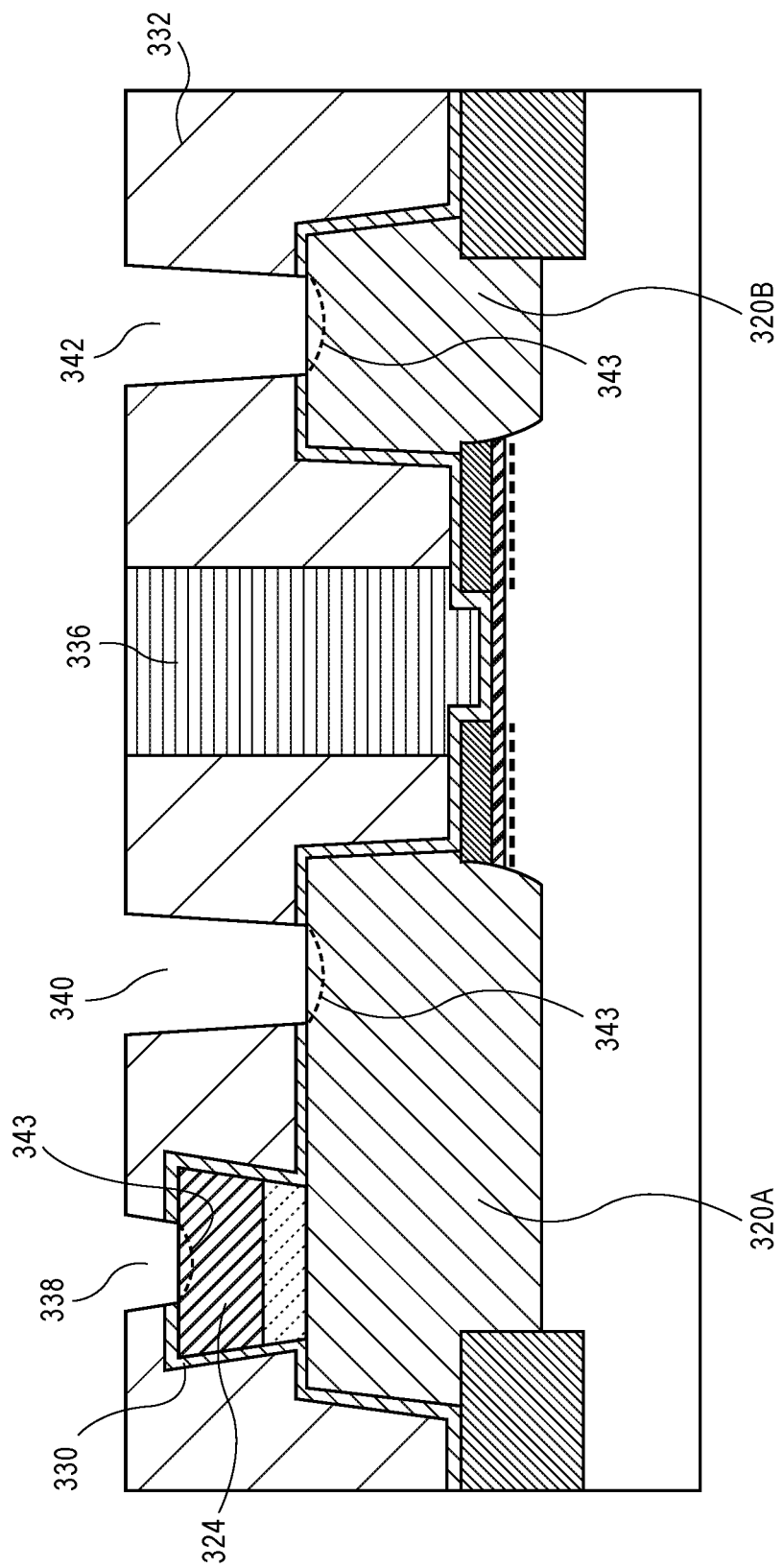
FIG. 3N illustrates the structure of FIG. 3M following the formation of an opening in a dielectric layer to expose the p-doped group III-N semiconductor material, an opening to expose the n-doped raised source structure and an opening to expose the n-doped raised drain structure.
Figure 3O:
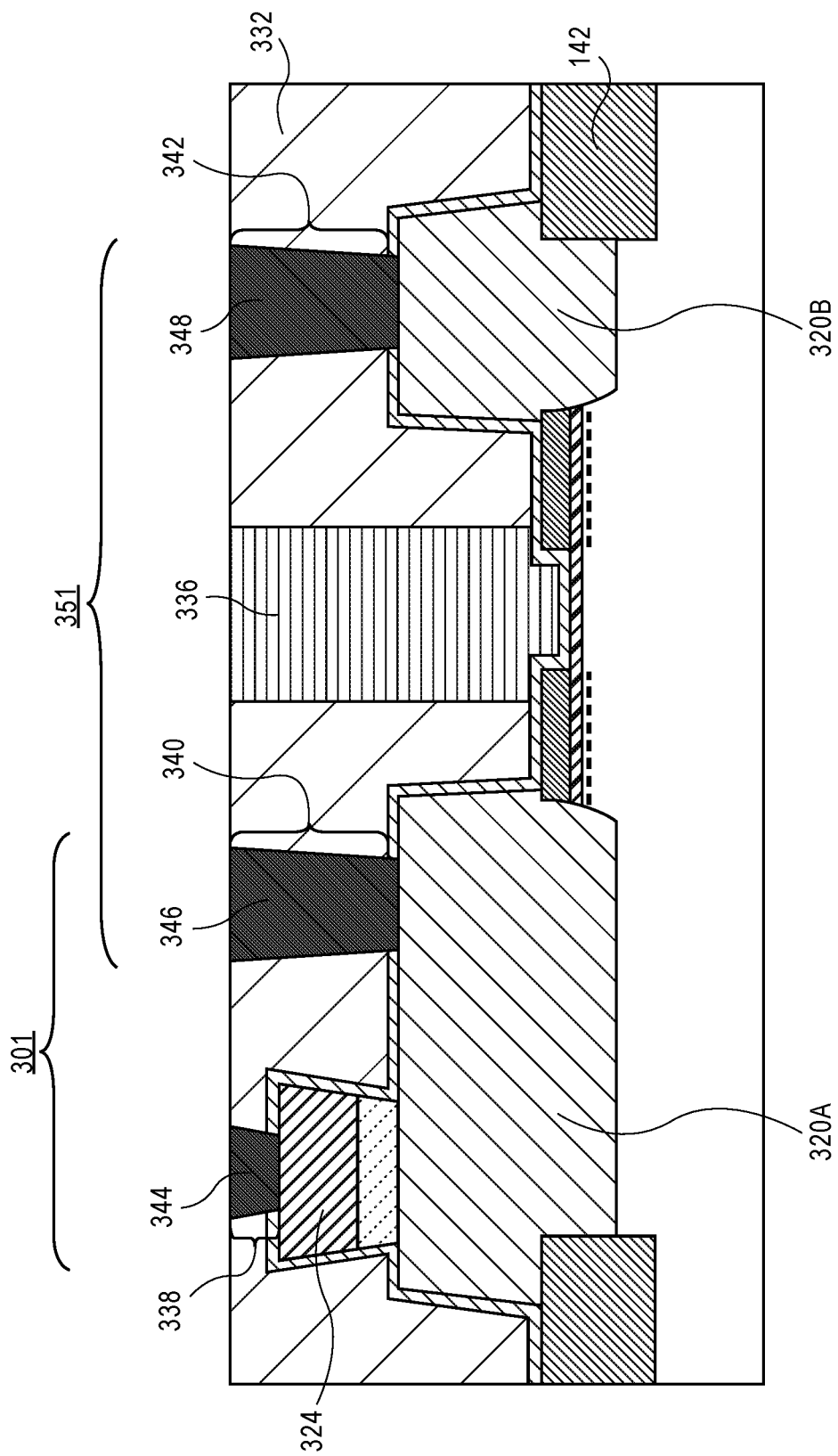

FIGS. 3A-3O illustrate cross-sectional views representing various operations in a method of fabricating a P-i-N diode 101 and a group III-N transistor 151 in a material layer stack such as is shown in the region 250 of FIG. 2E.

FIG. 3A illustrates an enhanced cross sectional view of the region 250 of the structure of FIG. 2E. In an embodiment the material layer stack includes a polish stop layer 315, the polarization charge inducing layer 314, the mobility enhancement layer 312 and the group III-N semiconductor material 310.

FIG. 3B illustrates the structure of FIG. 3A, following an etch process to form a plurality of isolation trenches 317A and 317B in the polish stop layer 315, the polarization charge inducing layer 314, the mobility enhancement layer 312 and in the group III-N semiconductor material 310. In an embodiment, the polish stop layer 315, the polarization charge inducing layer 314, the mobility enhancement layer 312 and the group III-N semiconductor material 310 are etched by a plasma etch process to form isolation trenches 317A and 317B. In an embodiment, each of the isolation trenches 317A and 317B have a depth that is approximately in the range of 100-150 nm as measured from an uppermost surface of the polish stop layer 315. In an embodiment, each of the isolation trenches 317A and 317B have a width that is approximately in the range of 100 nm-200 nm.

FIG. 3C illustrates the structure of FIG. 3B, following the formation of isolation regions 318A and 318B. In an embodiment, an isolation layer 318 is blanket deposited in the isolation trenches 317A and 317B, filling the trenches and on the polish stop layer 315. In an embodiment, exemplary composition and methods of forming the isolation layer 318 are such as is described above for dielectric layer 204. In an embodiment, the as deposited isolation layer 318 has a thickness that is in the range of 200 nm-500 nm. In an embodiment, the isolation layer 318 is subsequently planarized. In an embodiment, a chemical mechanical planarization (CMP) process is utilized to planarize the isolation layer 318. In an embodiment, the CMP process removes the isolation layer 318 from the uppermost surface of polish stop layer 315. In an embodiment, the polish process continues to polish and remove the polish stop layer from the uppermost surface of the polarization charge inducing layer 314. In an embodiment, the CMP process leaves the isolation layer 318 in each of the trenches 317A and 317B forming isolation regions 318A and 318B respectively. In an embodiment, the planarization process results in isolation region 318A and isolation region 318B having uppermost surfaces that are coplanar or substantially coplanar with uppermost surface of the polarization charge inducing layer 314.

FIG. 3D illustrates the structure of FIG. 3C, following the formation of drain trench 319A and source trench 319B in the polarization charge inducing layer 314, the mobility enhancement layer 312 and in the group III-N semiconductor material 310 adjacent to the isolation regions 318A and 318B, respectively. In an embodiment, drain trench 319A and source trench 319B are formed in the polarization charge inducing layer 314, the mobility enhancement layer 312 and a portion of the group III-N semiconductor material 310 by a plasma etch process. In one such embodiment, the plasma etch process utilizes medium to low energy ions and radicals (<5 eV ion energy) to form drain trench 319A and source trench 319B with tapered profiles as illustrated in FIG. 3D. In other embodiments, the drain trench 319A and the source trench 319B have vertical profile. In an embodiment, top portions of isolation regions 318A and 318B can have rounded profiles due to ion bombardment effects during a high energy (>5 eV ion energy) plasma etching process (indicated by dashed lines 325).

In an embodiment, each of the drain trench 319A and source trench 319B have a height between 60-100 nm. In an embodiment, the drain trench has a width designed to house a P-i-N diode as well as an electrode or a drain contact to be formed. By contrast the source trench 319B is designed to house a source contact. In an embodiment, the drain trench 319A has a width that is 50-100% greater than source trench 319B to accommodate both the P-i-N diode and an electrode. In an embodiment, the source trench 319B has a width similar to the width of the drain trench 319A. In an embodiment, the drain trench 319B has a width in the range of 200-400 nm and the source trench has a width that is in the range of 100-400 nm.

FIG. 3E illustrates the structure of FIG. 3D, following the formation of an n-doped raised drain structure 320A and an n-doped raised source structure 320B. In an embodiment, the n-doped raised drain structure 320A and the n-doped raised source structure 320B, are epitaxially grown sufficiently thick to fill trenches 319A and 319B respectively. In an embodiment, the n-doped raised drain structure 320A and the n-doped raised source structure 320B are grown using a metal organic chemical vapor deposition MOCVD process. In an embodiment, the n-doped raised drain structure 320A and the n-doped raised source structure 320B are grown by an MOCVD process at a temperature in the range of 700-800 degrees Celsius. In an embodiment, the n-doped raised drain structure 320A grows laterally and extends onto a portion of the isolation region 318A and onto a portion of polarization charge inducing layer 314. In an embodiment, the n-doped raised source structure 320B grows laterally and extends onto a portion of the isolation region 318B and onto a portion of polarization charge inducing layer 314.

In an embodiment, the n-doped raised drain structure 320A and n-doped raised source structure 320B include an n-doped group III-N semiconductor material such as n-doped GaN or n-doped $In_xGa_{1-x}N$, where x is between 0.01 and 0.1. In an embodiment, the n-doped group III-N semiconductor material is n-doped $In_xGa_{1-x}N$, where x is between 0.01 and 0.1. In an embodiment, an n-doped group III-N semiconductor material is doped in-situ during the growth process with an n-type dopant such as Si or Ge. In one embodiment, the n-type dopant is silicon. In an embodiment, the n-type dopant has a dopant density that is at least $1e19/cm^3$. In one embodiment, the n-doped raised drain structure 320A and the n-doped raised source structure 320B are silicon-doped $In_{0.1}Ga_{0.9}N$, having a dopant density that is at least $1e19/cm^3$.

In an embodiment, the n-doped raised drain structure 320A and the n-doped raised source structure 320B are epitaxially grown to a total thickness that is in the range of 150-200 nm. In an embodiment, given the differences in the widths of the drain and source trenches 319A and 319B, respectively, the n-doped raised drain structure 320A and the n-doped raised source structure 320B have a thickness that are unequal. In an embodiment, a combination of the height and width of the raised source structure 320A and the raised drain structure 320B and the n-type dopant density are chosen to achieve a contact resistance that is less than 200 ohms-micron per side. In an embodiment, the raised drain structure 320B and raised source structure 320A have a contact resistance of 200 ohms-micron per side to realize a group III-N transistor 151 having a drive current of at least 1 mA/micron.

FIG. 3F illustrates the structure of FIG. 3E, following the formation of a diode opening 321 in a second dielectric layer 322 to expose an uppermost surface of the raised drain structure 320A for a subsequent formation of a P-i-N diode. The second dielectric layer 322 is formed on the structure of FIG. 3G. In an embodiment, a layer of a dielectric material such as but not limited to silicon oxide, silicon oxynitride or silicon carbide is deposited using a process such as but limited to a PEVCD, CVD or a PVD deposition process. In an embodiment, the as-deposited second dielectric layer 322 is subsequently planarized. The diode opening 321 is formed in the second dielectric layer 322 over a portion of the raised drain structure 320A as illustrated in FIG. 3F. In an embodiment, the diode opening 321 has a width, WD, at the bottom of the opening that is approximately in the range of 50 nm-200 nm.

FIG. 3G illustrates the structure of FIG. 3F, following the formation of an intrinsic group III-N semiconductor layer 323 on the n-doped raised drain structure 320A and a p-doped group III-N semiconductor material 324 on the intrinsic group III-N semiconductor layer 323 in the diode opening 321.

1 In an embodiment, an intrinsic group III-N semiconductor layer 323 is grown to fill the lateral portion of the diode opening 321. In an embodiment, the intrinsic group III-N semiconductor layer 323 is epitaxially grown on the exposed portion of the raised drain structure 320A by a MOCVD process at a temperature in the range of 700-800 degrees Celsius. In an embodiment, the intrinsic group III-N semiconductor layer 323 includes a material such as an undoped $In_xGa_{1-x}N$, where X ranges from 0.1-0.2. In an embodiment, an intrinsic $In_xGa_{1-x}N$ is intrinsic-$In_{0.2}Ga_{0.8}N$, chosen to enable a lower bandgap than the n-doped raised drain structure 320A directly below to reduce the P-i-N diode turn on voltage to less than 3V. In an embodiment, the thickness of the intrinsic group III-N semiconductor layer 323 ranges from 5 nm-10 nm.

In an embodiment, the p-doped group III-N semiconductor material 324 is grown on the uppermost surface of the intrinsic group III-N semiconductor layer 323 in the diode opening 321. In an embodiment, the p-doped group III-N semiconductor material 324 is grown on a portion of the raised drain structure 320A in the diode opening 321 by a MOCVD process at a temperature in the range of 900-1050 degrees Celsius. In an embodiment, the p-type dopant includes a species such as magnesium (Mg). In an embodiment, the p-doped group III-N semiconductor material 324 is a p-doped GaN or Mg-doped $In_xGa_{1-x}N$ where $0<x<0.3$. In one such embodiment, the Mg-doped group III-N semiconductor material 324 is a Mg-doped GaN, chosen to have a higher bandgap than the intrinsic group III-N semiconductor layer 323 directly below. In an embodiment, the p-type dopant has a dopant density that is at least $1e17/cm^3$. In one such specific embodiment, the p-doped group III-N semiconductor material 324 is a Mg-doped GaN having a magnesium dopant density that is at least $1e17/cm^3$. In an embodiment, the p-doped group III-N semiconductor material 324 includes a Mg-doped GaN, that is doped to at least $1e17/cm^3$, and has a thickness of at least 50 nm. In a different embodiment, the formation of the intrinsic group III-N semiconductor material 323 is bypassed, and the p-doped group III-N semiconductor material 324 is deposited directly on the n-doped raised drain structure 320A to form a PN diode.

In an embodiment, the remainder of the group III-N transistor fabrication process operations are carried out after a high temperature growth process is utilized to form the p-doped group III-N semiconductor material 324.

FIG. 3H illustrates the structure of FIG. 3G, following the formation of an opening 327 in the dielectric layer to expose a portion of the polarization charge inducing layer. In an embodiment, a third dielectric layer 326 is first formed on the uppermost surface of the second dielectric layer 322 and on the uppermost surface of the p-doped group III-N semiconductor material 324. In an embodiment, the third dielectric layer is planarized. In an embodiment, the third dielectric layer 326 is a layer that has a composition similar to the second dielectric layer 322. In an embodiment, the third dielectric layer 326 has a thickness of 40 nm-80 nm, chosen to accommodate formation of an electrode layer on the p-doped group III-N semiconductor material 324. In an embodiment, an opening 327 is formed by a plasma etch process and exposes the underlying polarization charge inducing layer 314.

FIG. 3I illustrates the structure of FIG. 3H, following the formation of a gap 328 in the polarization charge inducing layer 314 to expose the mobility enhancement layer 312. In an embodiment, the exposed portions of the polarization charge inducing layer 314, is removed by a plasma etch process to form the gap 328. In an embodiment, the underlying mobility enhancement layer 312 is exposed by formation of the gap 328. In an embodiment, the polarization charge inducing layer 314 is separated into a first portion 314A and a second portion 314B of the polarization charge inducing layer 314 by formation of the gap 328. Furthermore, the absence of the polarization charge inducing layer 314 in the gap 328 leads to depletion of 2DEG from underneath the gap 328 (as indicated by the break in the dashed line 316 under the gap 328.)

In an embodiment, the polarization charge inducing layer 314 includes a material such InAlN or AlGaN and the underlying mobility enhancement layer 312 is AlN. In one such embodiment, the plasma etch process utilized to form the gap 328 includes process gases such as but not limited to $SF_6$, $BCl_3$, $Cl_2$, Ar and $N_2$.

In an embodiment, the gap 328 has a width, at the bottom of the opening, WB, that is approximately in the range of 30 nm-500 nm. In particular, the width, Wa, of the gap 328 defines a gate length of group III-N transistor. In an embodiment, the gap 328 is formed midway between the raised source structure 320A and the raised drain structure 320B. In other embodiments, the gap 328 is formed closer to the raised source structure 320A than to the raised drain structure 320B.

In an embodiment, a small portion of the polarization charge inducing layer 314 in the gap 328 is not removed by the plasma etch process. In one such embodiment, the underlying mobility enhancement layer 312 is not exposed by the gap 328. In one such embodiment, the remaining portions of the polarization charge inducing layer 314 has a thickness that is less than the thickness needed to induce 2DEG in the group III-N semiconductor material 310 under the gap 328. Depending on the plasma etch process parameters, the etch may (a) leave a uniformly thin layer of the polarization charge inducing layer 314 or (b) create a bowl-shaped profile in the polarization charge inducing layer 314.

In an embodiment, following the formation of the gap 328, the second dielectric layer 322 and the third dielectric layer 326 are removed. In other embodiments, as will be discussed in FIG. 4A, the second dielectric layer 322 and the third dielectric layer 326 remain for subsequent processing.

FIG. 3J illustrates the structure of FIG. 3I, following the deposition of a gate dielectric layer. In an embodiment, the gate dielectric layer 330 is blanket deposited on the exposed portions of the mobility enhancement layer 312 opened by the gap 328, and on the sidewalls and on the uppermost surface of the n-doped raised drain structure 320A and the n-doped raised source structure 320B. In an embodiment, the gate dielectric layer 330 is also formed on the sidewalls of the intrinsic group III-N semiconductor layer 323, and on the sidewalls and on the uppermost surface of the p-doped group III-N semiconductor material 324. In an embodiment, the gate dielectric layer 330 is also formed on the uppermost surface of the isolation regions.

Suitable materials for the forming a gate dielectric layer 330 include dielectric materials such as but not limited to $Al_2O_3$, $HfO_2$, $ZrO_2$, TiSiO, HfSiO or $Si_3N_4$. In an embodiment, the gate dielectric layer 326, is formed by an atomic layer deposition (ALD) process. In an embodiment, the gate dielectric layer 330 has a thickness approximately in the range of 2 nm-10 nm.

FIG. 3K illustrates the structure of FIG. 3J, following the formation of a gate opening 333 in a fourth dielectric layer 332 above the gap 328. In an embodiment, the fourth dielectric layer 332 is blanket deposited on the gate dielectric layer 330. Exemplary layer composition, thickness and method of forming the fourth dielectric layer 332 may be as is described above for layer composition and method of forming dielectric layer 322. In an embodiment, the fourth dielectric layer 332 is plasma etched through a trench mask to form the gate opening 333. The gate opening 333 formed by the plasma etch process exposes a portion of the gate dielectric layer 330 above the gap 328. The gate opening 333 defines a location for a subsequent formation of a gate electrode of a group III-N transistor. In an embodiment, the fourth dielectric layer 332 is silicon dioxide. In one such embodiment, a silicon dioxide fourth dielectric layer 332 is reactive-ion etched utilizing a chemistry including Ar, $O_2$, CO and a fluorocarbon such as but not limited to CHF$_3$, CH$_2$F$_2$, or C$_4$F$_8$. In an embodiment, the gate opening 333 is formed in the fourth dielectric layer 332 by a plasma etch having an ion energy less than 0.3 eV, so that damage to the critical gate dielectric layer 330 may be avoided. In one such embodiment, the gate opening 333 has a tapered profile due to a less energetic etch process.

FIG. 3L illustrates the structure of FIG. 3K, following the formation of a work function layer 334 on the gate dielectric layer 330, in the gate opening 333. In an embodiment, a work function layer 334 is deposited into the gate opening 333 and on the uppermost surface of the fourth dielectric layer 332 by a blanket deposition process. In an embodiment, work function layer 334 is deposited by a PVD or and ALD deposition process to fill the gate opening 333. In an embodiment, the deposition process also deposits an excess amount of work function layer 334 on the surface of the fourth dielectric layer 332. In an embodiment, exemplary materials and composition of the work function layer 334 are as described above for gate electrode 128.

FIG. 3M illustrates the structure of FIG. 3L following the formation of a gate electrode 336. In an embodiment, the excess work function layer 334 is removed from uppermost surface of the second fourth dielectric layer 332 by a planarization process. In an embodiment, the planarization process includes a CMP process. In an embodiment, the CMP process leaves work function layer 334 in and filling the gate opening 333 to form a gate electrode 336. In an embodiment, uppermost surfaces of the second fourth dielectric layer 332 and gate electrode 336 are co-planar or substantially co-planar after the CMP process.

FIG. 3N illustrates the structure of FIG. 3M following the formation of a diode opening 338 to expose the p-doped group III-N semiconductor material 324, and an electrode opening 340 to expose the n-doped raised drain structure 320A and a source opening 342 to expose the n-doped raised source structure 320B. In an embodiment, the diode opening 338, the electrode opening 340, and the source opening 342 are formed by a plasma etch process subsequent to a process of patterning of a resist layer to define locations of the diode opening 338, the electrode opening 340 and source opening 342. It is to be appreciated that etching of the gate dielectric layer 330, may lead to erosion of the uppermost surfaces of the p-doped group III-N semiconductor material 324 and the n-doped raised drain structure 320A and the n-doped raised source structure 320B (indicated by dashed lines 343.) The size of the opening 338 is smaller relative to the width of the p-doped group III-N semiconductor material 324 to prevent shorting between the p-doped group III-N semiconductor material 324 and the n-doped raised drain structure 320A. In an embodiment, the first electrode 344, the second electrode 346 and the source contact 348 have a width that ranges from 50 nm-200 nm.

FIG. 3O illustrates the structure of FIG. 3N, following the formation of a first electrode 344 on the p-doped group III-N semiconductor material 324, formation of a second electrode 346 on the n-doped raised drain structure 320A and the formation of a source contact 348 on the n-doped raised source structure 320B. It is to be appreciated that while the gate electrode 336 was formed before formation of the first electrode 344, the second electrode 346, and the source contact 348 the order of formation may be reversed.

In an embodiment, a contact metal layer is deposited inside and fills the diode opening 338, the electrode opening 340 and the source opening 342 by a PVD or a CVD blanket deposition process. The blanket deposition process also deposits excess contact metal layer on the uppermost layer of the fourth dielectric layer 332 and on the uppermost surface of the gate electrode 336. In an embodiment, suitable contact metals include metals such as but not limited to Ti, Al or Ni. In an embodiment, a planarization process is carried out to remove the excess contact metal layer from the uppermost surface of the fourth dielectric layer 332. In an embodiment, the excess contact metal layer is polished back to form a source contact 348 on the n-doped raised source structure 320B, a first electrode 344 on the p-doped group III-N semiconductor material 324 and a second electrode 346 on the n-doped raised drain structure 320A. In an embodiment, the first electrode 344, the second electrode 346 and the source contact 348 can include more than one layer of separate and distinct contact metals. In other embodiments, the first electrode 344, the second electrode 346 and the source contact 348 may include one or more contact metal layers capped by a layer of tungsten.

It is to be appreciated that the second electrode 346 is shared between the group III-N transistor 351 and the P-i-N diode 301. In other words, second electrode 346 acts as drain contact for the group III-N transistor 351 and as an electrode for the P-i-N diode 301.

Figure 4A:
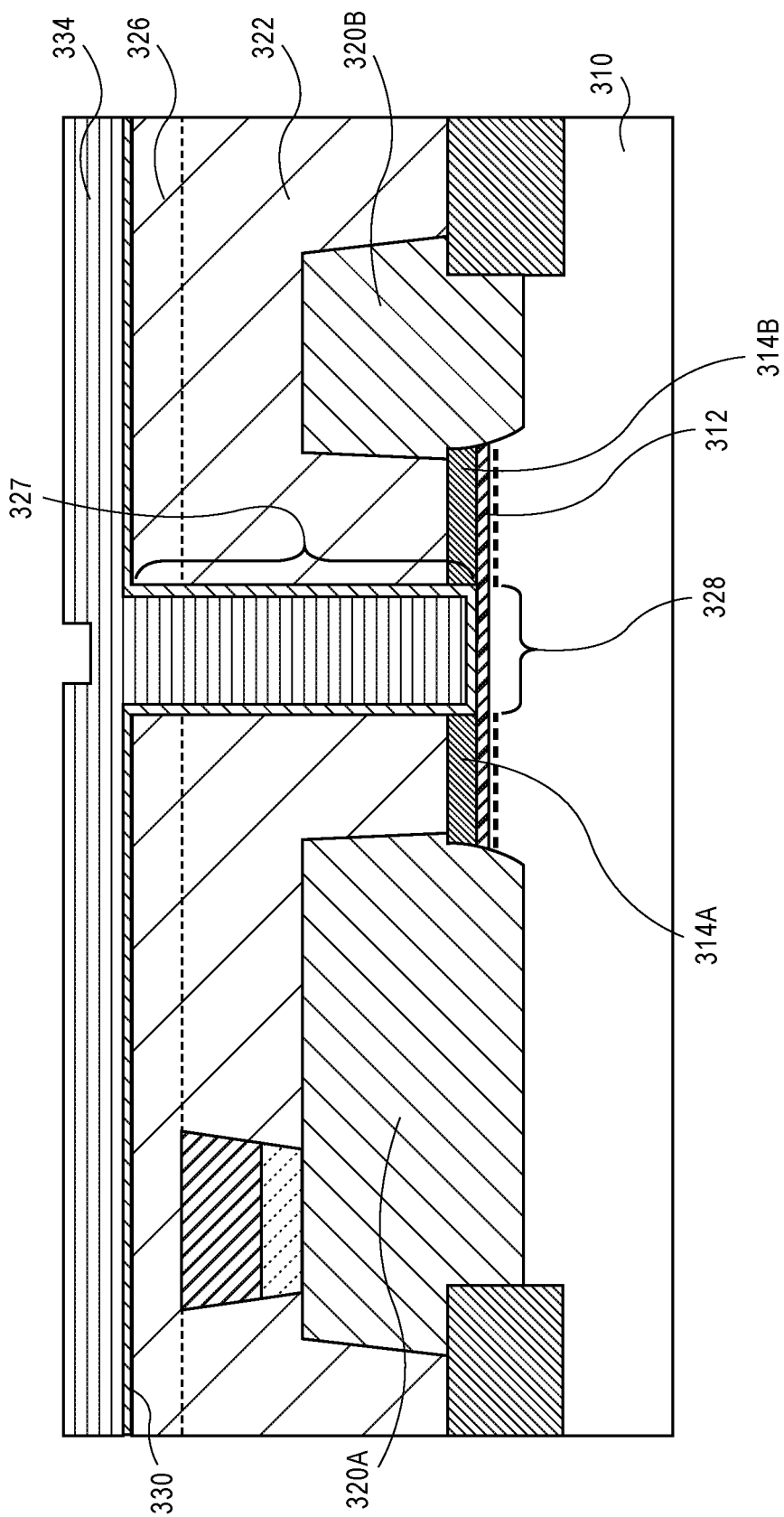
FIGS. 4A-4C illustrate cross-sectional views representing various operations in a method of forming a gate dielectric layer and a gate electrode that is confined to a location above a gap in the polarization charge inducing layer.
Figure 4B:
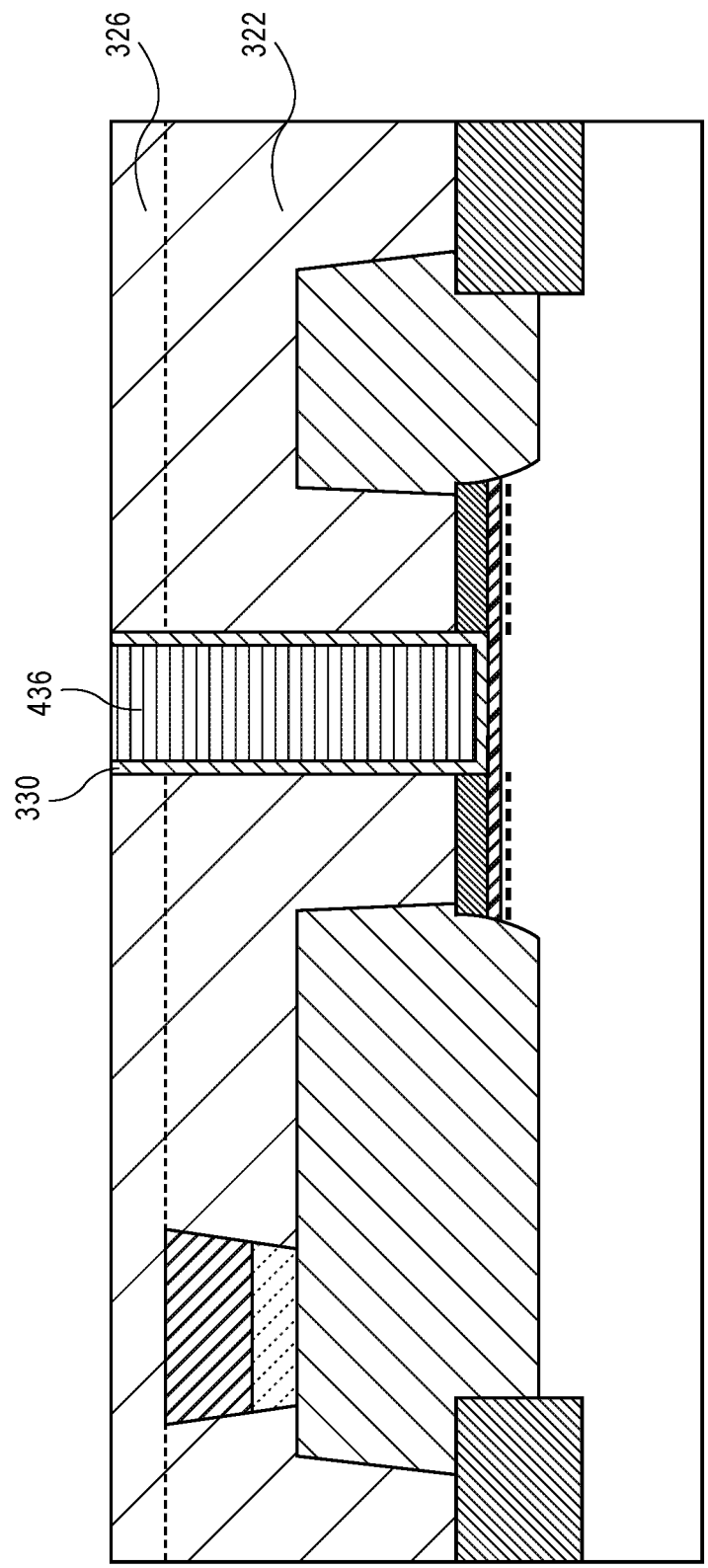
Figure 4C:
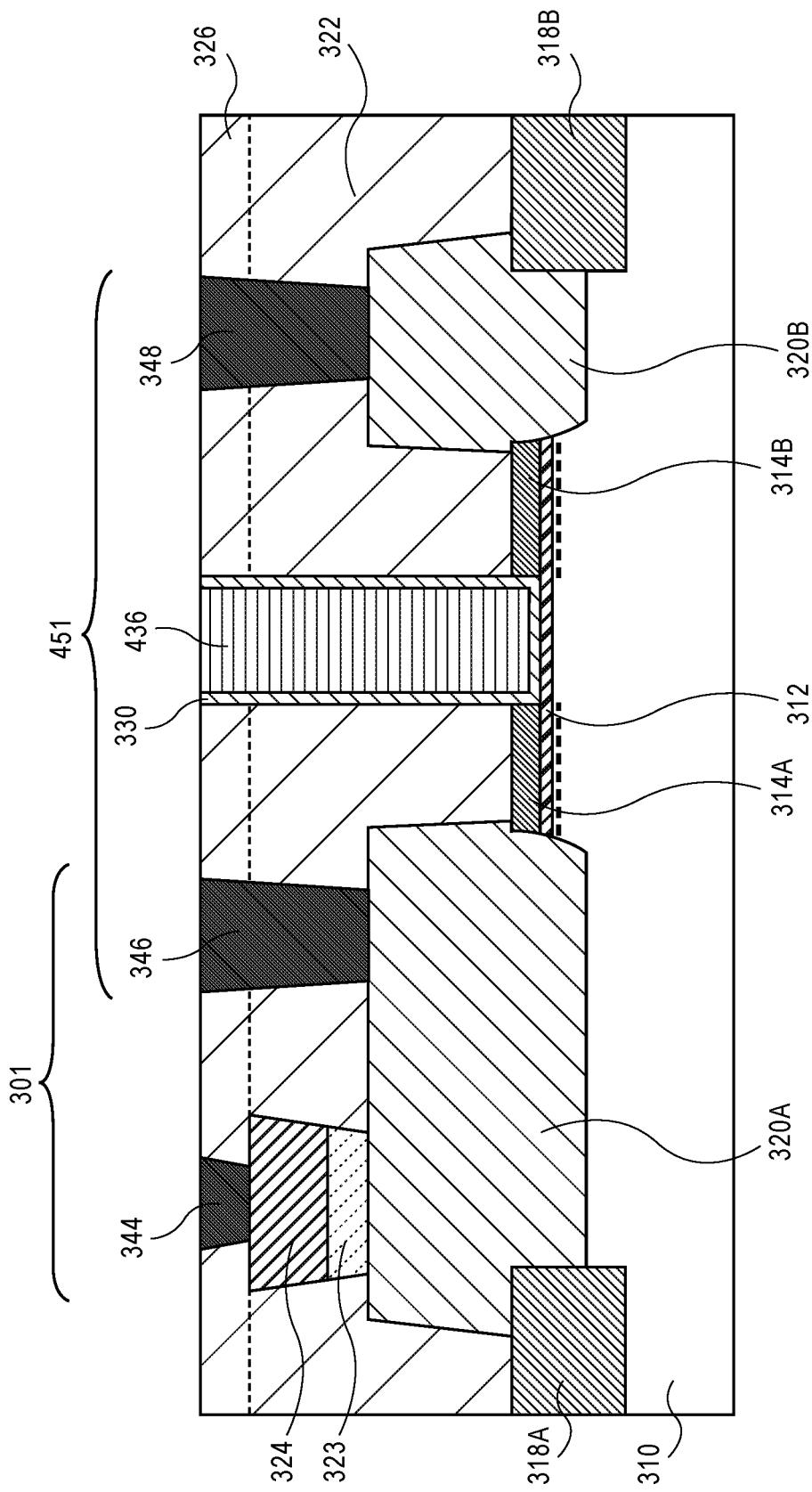

FIGS. 4A-4C illustrate cross-sectional views representing various operations in a method of forming a gate dielectric layer 330 and a gate electrode 436 that is confined to a gap 328 above the mobility enhancement layer 312.

FIG. 4A illustrates the structure of FIG. 3I following the formation of a gate dielectric layer 330 and a work function layer 334 in the opening 327. In an embodiment, the gate dielectric layer 330 is formed in the gap 328, on the mobility enhancement layer 312, on sidewalls of the second dielectric layer 322 and the third dielectric layer 326 exposed by the opening 327, and on the uppermost surface of the dielectric layer 326. In an embodiment, the gate dielectric layer is confined to an opening above the gap 328 and does not extend beyond the gap 328 on to the first and second portions 314A or 314B of the polarization charge inducing layer 314 or above the uppermost surface of the p-doped group III-N semiconductor material 324. A work function layer 334 is subsequently deposited on the gate dielectric layer 330 in the opening 327, and on the gate dielectric layer 330 formed on the uppermost surface of dielectric layer 326. In an embodiment, the work function layer 334 is deposited by a PVD or an ALD process.

FIG. 4B illustrates the formation of a gate electrode 436 on the gate dielectric layer 330 above the gap 328. In an embodiment, the excess work function layer 334 and the gate dielectric layer 330 formed on the uppermost surface of the third dielectric layer 326 is removed by a planarization process. In an embodiment, the planarization process includes a CMP process. In an embodiment, the CMP process first removes the work function layer 334 from above the third dielectric layer 326 and then continues to remove the gate dielectric layer 330 from the uppermost surface of the dielectric layer 326. The CMP process leaves the work function layer 334 and the gate dielectric layer 330 in the opening 327 to form a gate electrode 436. In an embodiment, uppermost surfaces of the dielectric layer 326, the gate electrode 436 and the gate dielectric layer 330 are co-planar or substantially co-planar after the CMP process. It is to be appreciated that in contrast to gate electrode 336, the gate electrode 436 does not extend over the first portion 314A or the second portion 314B of the polarization layers 314, and prevents stray gate capacitance due to L$_{OV}$, described in connection with FIG. 1.

FIG. 4C illustrates the structure of FIG. 4B, following the formation of a P-i-N diode 301 and a group III-N transistor 451 in an accordance with an embodiment of the present invention. In an embodiment, the gate electrode 436 is formed before the formation of the first electrode 344, the second electrode 346, and the source contact 348. In an embodiment, the gate electrode 436 is formed after the formation of the first electrode 344, the second electrode 346, and the source contact 348. In an embodiment, the first electrode 344, the second electrode 346, and the source contact 348 are formed using materials and methods described in connection with FIG. 3N-3O.

Figure 5:
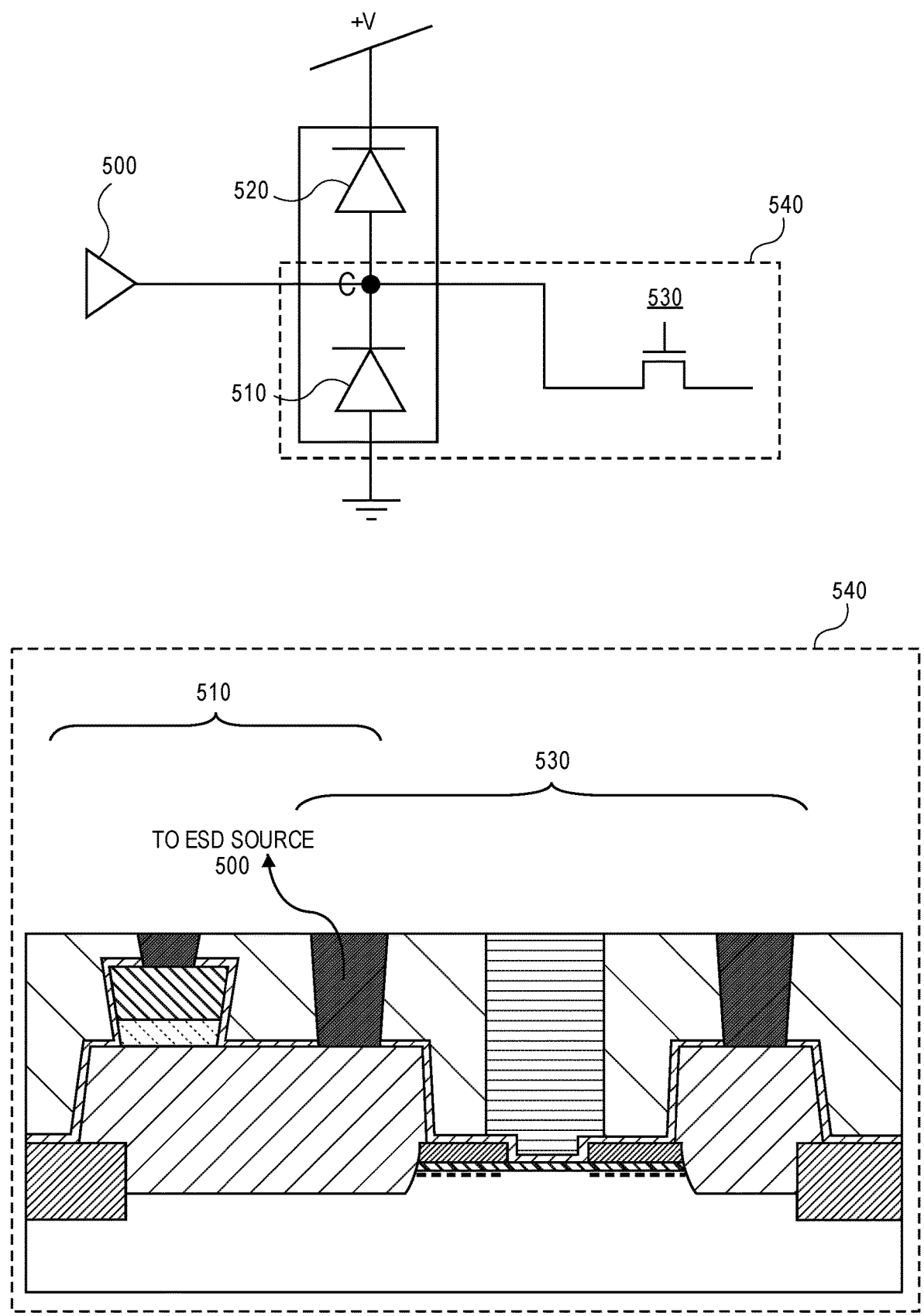
FIG. 5 illustrates a circuit layout having a P-i-N diode connected between an ESD source and an ESD protected transistor.

FIG. 5 illustrates a circuit 540 demonstrating a P-i-N diode 510 connected between a location where an ESD can take place, pin 500 and a transistor 530 that is ESD protected. In an embodiment, diode 510 is connected to a transistor 530 in circuit (540). The anode of diode 510 is connected to ground and the cathode of diode 510 is connected to the drain of the transistor 530 (point C). The pin 500 is connected to the cathode of diode 510 (point C) and also to the drain of the transistor 530. Diodes 510 offers a low resistance path during an ESD event as current can be diverted away from the transistor 530 under protection. In an embodiment, diode 510 includes P-i-N diodes such as P-i-N diode 301 and the transistor 530 in the circuit 540 includes a group III-N transistor such as a group III-N transistors 351 in accordance with an embodiment of the present invention. In an embodiment, an external diode 520 is connected to the drain of the transistor 530 and cathode of the diode 510 (point C) as part of an external circuit.

Figure 6:
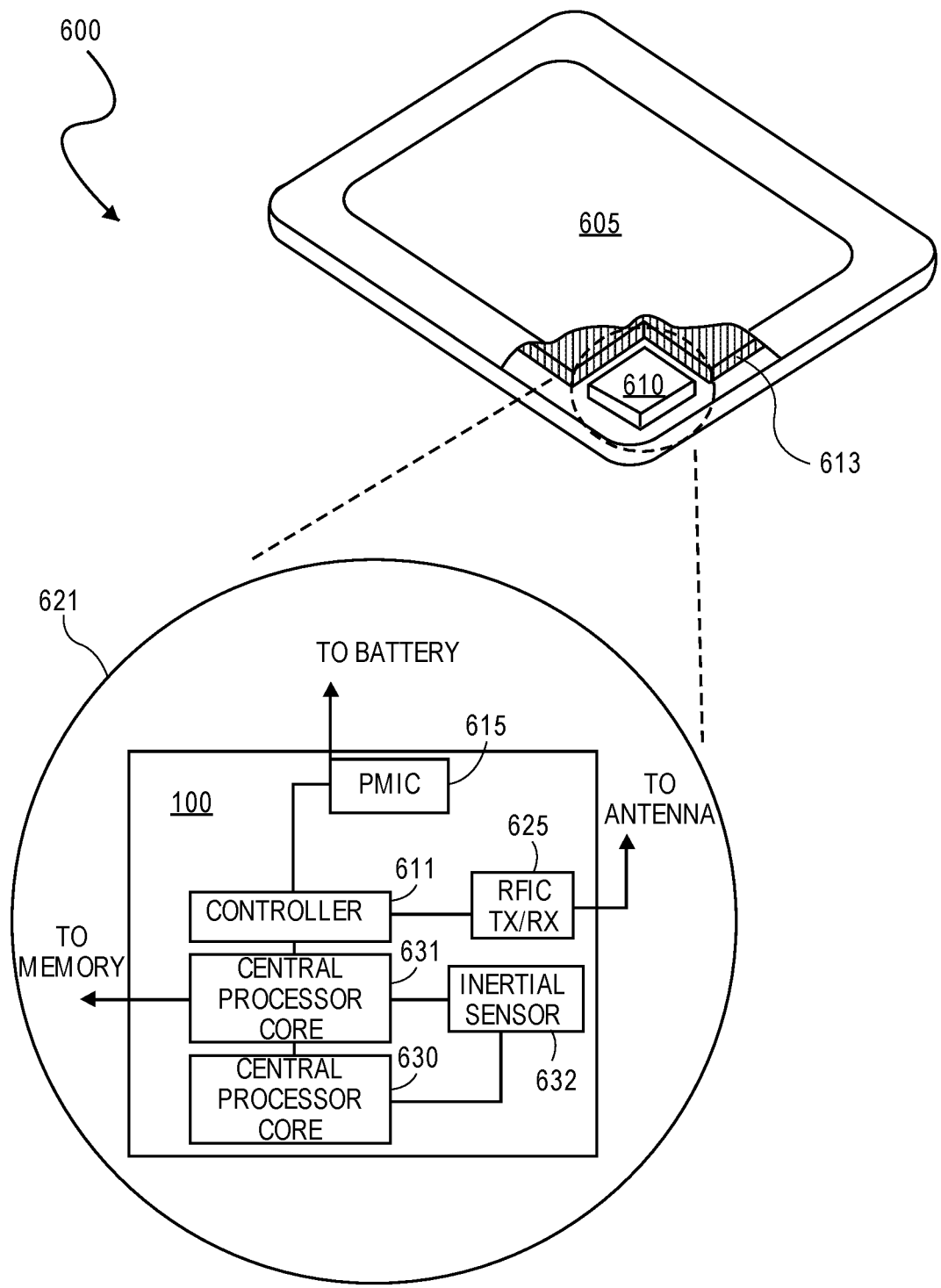
FIG. 6 is a functional block diagram of a group III-N SoC including P-i-N diode with group III-N transistor of a mobile computing platform, in accordance with an embodiment of the present invention.

FIG. 6 is a functional block diagram of a group III-N SoC (system on chip) implementation of a mobile computing platform, in accordance with an embodiment of the present invention. The mobile computing platform 600 may be any portable device configured for each of electronic data display, electronic data processing, and wireless electronic data transmission. For example, mobile computing platform 600 may be any of a tablet, a smart phone, laptop computer, etc. And includes a display screen 605 that is in the exemplary embodiment a touchscreen (e.g., capacitive, inductive, resistive, etc.) permitting the receipt of user input, the SoC 610, and a battery 613. As illustrated, the greater the level of integration of the SoC 610, the more of the form factor within the mobile computing platform 600 that may be occupied by the battery 613 for longest operative lifetimes between charging, or occupied by memory (not depicted), such as a solid state drive, for greatest functionality.

Depending on its applications, mobile computing platform 600 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 610 is further illustrated in the expanded view 621. Depending on the embodiment, the SoC 610 includes a portion of a substrate 100 (i.e., a chip) upon which two or more of a power management integrated circuit (PMIC) 615, RF integrated circuit (RFIC) 625 including an RF transmitter and/or receiver, a controller 611 thereof, and one or more central processor core 630, 631 and inertial sensor 632 is fabricated. The RFIC 625 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 625 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 615 and RFIC 625. In embodiments of the present invention, the PMIC 615 and RFIC 625 employ one or more of the P-i-N diodes and group III-N transistors as described herein (e.g., group III-nitride transistor 100). In an embodiment, the P-i-N diodes 101 include group III-N semiconductor material 110 such as GaN with a polarization charge inducing layer 114 including InGaN. In further embodiments the PMIC 615 and RFIC 625 employing the P-i-N diodes and group III-nitride transistors described herein are integrated with one or more of the controller 611 and processor cores 630, 631 provided in silicon CMOS technology monolithically integrated with the PMIC 615 and/or RFIC 625 onto the (silicon) substrate 101. It will be appreciated that within the PMIC 615 and/or RFIC 625, the high voltage, high frequency capable group III-nitride transistors described herein need not be utilized in exclusion to CMOS, but rather silicon CMOS may be further included in each of the PMIC 615 and RFIC 625.

The P-i-N diodes and group III-nitride transistors described herein may be specifically utilized where a high voltage swings present (e.g., 8-10V battery power regulation, DC-to-DC conversion, etc. within the PMIC 615). As illustrated, in the exemplary embodiment the PMIC 615 has an input coupled to the battery 613 and has an output provide a current supply to all the other functional modules in the SoC 610. In a further embodiment, where additional ICs are provided within the mobile computing platform 600 but off the SoC 610, the PMIC 615 output further provides a current supply to all these additional ICs off the SoC 610. Particular embodiments of the group III-nitride transistors described herein permit the PMIC to operate at higher frequencies. In certain such embodiments, inductive elements within the PMIC (e.g., buck-boost convertors, etc.) may be scaled to much smaller dimensions. As such inductive elements in the PMIC account for 60-80% of chip area, embodiments of the PMIC implemented in the group III-nitride transistors described herein offer a significant shrink over other PMIC architectures.

As further illustrated, in the exemplary embodiment the PMIC 615 has an output coupled to an antenna and may further have an input coupled to a communication module on the SoC 610, such as an RF analog and digital baseband module (not depicted). Alternatively, such communication modules may be provided on an IC off-chip from the SoC 610 and coupled into the SoC 610 for transmission. Depending on the group III-nitride materials utilized, the P-i-N diodes and group III-nitride transistors described herein (e.g., P-i-N diode 101 group III-N transistor 151) may further provide the large power added efficiency (PAE) needed from a power amplifier transistor having an Ft of at least ten times carrier frequency (e.g., a 1.9 GHz in an RFIC 625 designed for 3G or GSM cellular communication).

Figure 7:
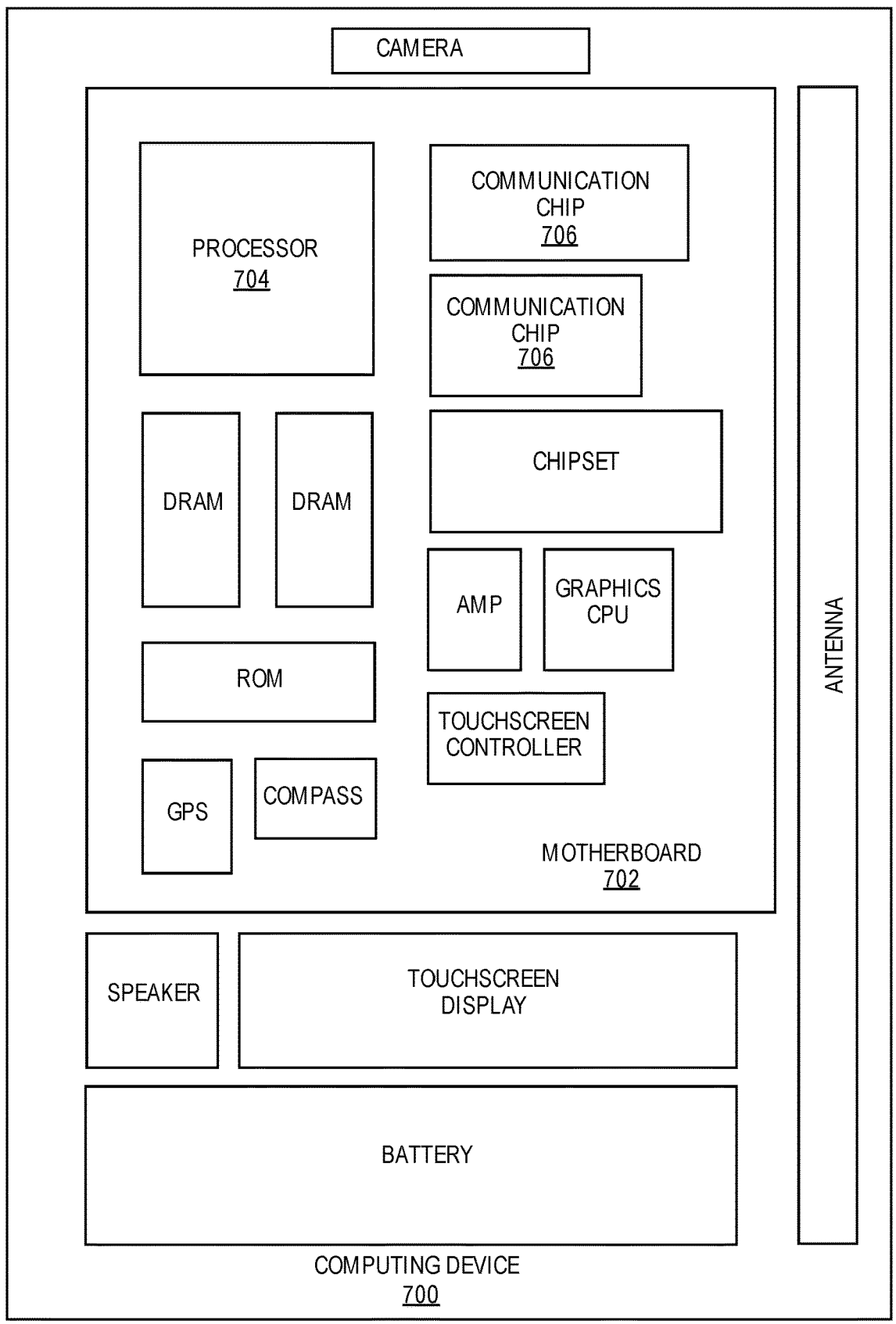
FIG. 7 illustrates a computing device in accordance with embodiments of the present invention.

FIG. 7 illustrates a computing device 700 in accordance with embodiments of the present invention. Illustrates an example computing device 700 implemented with the integrated circuit structures and/or techniques provided herein, in accordance with some embodiments of the present disclosure. As can be seen, the computing device 700 houses a motherboard 702. The motherboard 702 may include a number of components, including, but not limited to, a processor 704 that includes P-i-N diodes and group III-N transistors integrated with silicon CMOS transistors and at least one communication chip 706, each of which can be physically and electrically coupled to the motherboard 702, or otherwise integrated therein. As will be appreciated, the motherboard 702 may be, for example, any printed circuit board, whether a main board, a daughterboard mounted on a main board, or the only board of system 700, etc.

Depending on its applications, computing device 700 may include one or more other components that may or may not be physically and electrically coupled to the motherboard 702. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 700 may include one or more integrated P-i-N diodes and group III-nitride transistors formed using the disclosed techniques in accordance with an example embodiment or P-i-N diodes and group III-nitride transistors integrated with silicon CMOS transistor devices. In some embodiments, multiple functions can be integrated into one or more chips (e.g., for instance, note that the communication chip 706 can be part of or otherwise integrated into the processor 704).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others. In some embodiments, communication chip 706 may be implemented with the techniques and/or structures variously described herein, such that the communication chip 706 includes one or more P-i-N diodes and group III-nitride transistors including a dual drain/gate and single source heterostructure design, for example.

The processor 704 of the computing device 700 includes an integrated circuit die packaged within the processor 704. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 706 also may include an integrated circuit die packaged within the communication chip 706. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 704 (e.g., where functionality of any chips 706 is integrated into processor 704, rather than having separate communication chips). Further note that processor 704 may be a chip set having such wireless capability. In short, any number of processor 704 and/or communication chips 706 can be used. Likewise, any one chip or chip set can have multiple functions integrated therein.

In various implementations, the computing device 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Figure 8:
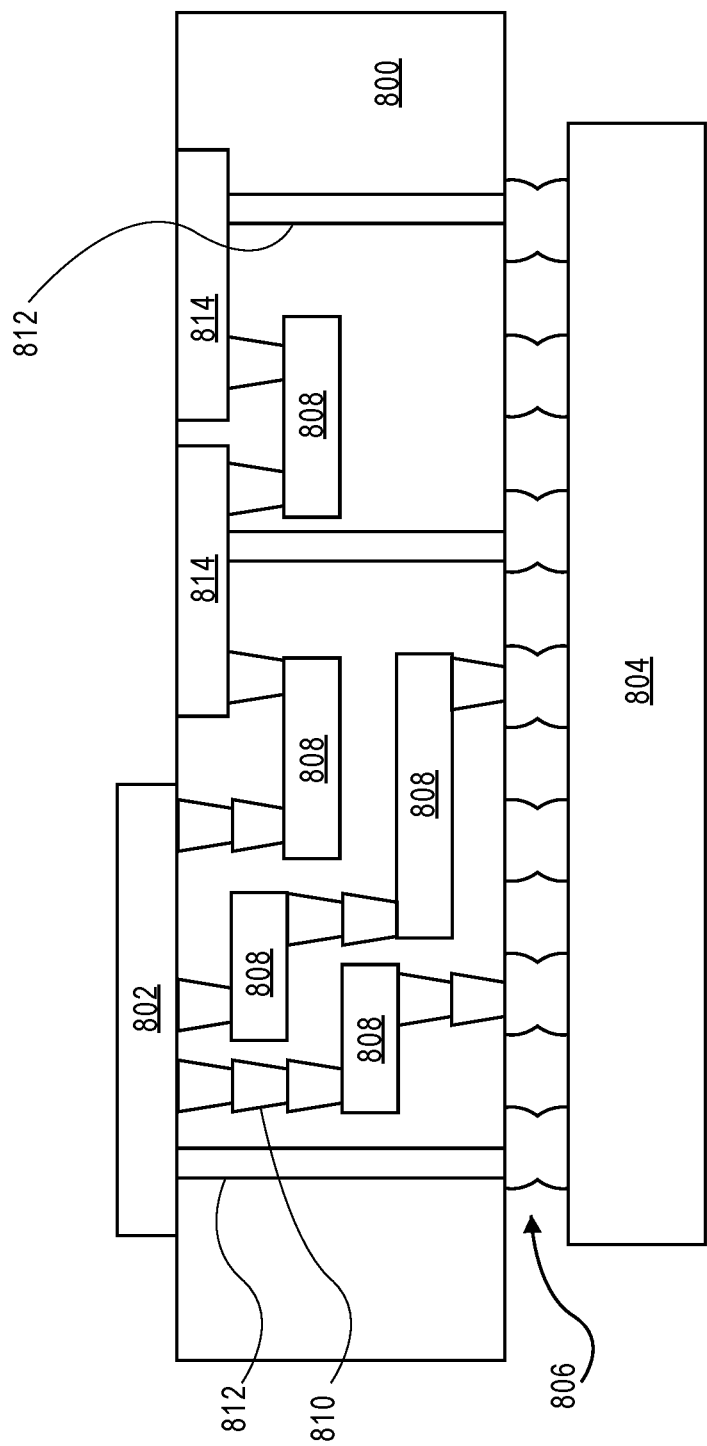
FIG. 8 illustrates an interposer in accordance with embodiments of the present invention.

FIG. 8 illustrates an interposer 800 in accordance with embodiments of the present invention. The interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a logic module including a collection of P-i-N diodes and group III-N transistors to form integrated circuits, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

Thus, embodiments of the present invention include a P-i-N diode and connected group III-N device and their methods of fabrication.

Example 1

A P-i-N diode structure includes a group III-nitride (N) semiconductor material disposed on a substrate. An n-doped raised drain structure is disposed on the group III-N semiconductor material. An intrinsic group III-N semiconductor material is disposed on the n-doped raised drain structure. A p-doped group III-N semiconductor material is disposed on the intrinsic group III-N semiconductor material. A first electrode is connected to the p-doped group III-N semiconductor material. A second electrode is electrically coupled to the n-doped raised drain structure.

Example 2

The P-i-N diode structure of Example 1, wherein the group III-N semiconductor material includes gallium nitride (GaN).

Example 3

The P-i-N diode structure of Example 1, wherein the n-doped raised drain structure is InGaN, and further wherein the n-doped raised drain structure is doped with a dopant species having a density of at least $1e19/cm^3$.

Example 4

The P-i-N diode structure of Example 1, wherein the p-doped group III-N semiconductor material is p-doped GaN.

Example 5

The P-i-N diode structure of Example 1, wherein the intrinsic group III-N semiconductor material is indium gallium nitride (InGaN) and further wherein, the intrinsic group III-N semiconductor material has a thickness that varies between 0-10 nm.

Example 6

The P-i-N diode structure of Example 1 or Example 5, wherein the amount of indium in the intrinsic InGaN layer is greater the amount of indium in the n-doped raised drain structure.

Example 7

A group III-Nitride (III-N) semiconductor structure includes a group III-N semiconductor material disposed on a substrate and a group III-N transistor structure. The group III-N transistor structure includes a raised n-doped drain structure disposed on the group III-N semiconductor material. A raised n-doped source structure is disposed on the group III-N semiconductor material. A mobility enhancement layer is disposed on the group III-N semiconductor material, between the n-doped raised source structure and the n-doped raised drain structure. A polarization charge inducing layer is disposed above the mobility enhancement layer between the raised source structure and the raised drain structure. The polarization charge inducing layer has a first portion and a second portion that is separated by a gap. A gate dielectric layer is disposed on the mobility enhancement layer in the gap. A gate electrode is disposed on the gate dielectric layer above the gap between the raised drain structure and the raised source structure. The group III-Nitride (III-N) semiconductor structure further includes a P-i-N diode structure. The P-i-N diode structure includes the raised n-doped drain structure disposed on the group III-N semiconductor material. An intrinsic group III-N semiconductor material is disposed on the n-doped raised drain structure. A p-doped group III-N semiconductor material is disposed on the intrinsic group III-N semiconductor material. A first electrode is connected to the p-doped group III-N semiconductor material. A second electrode is electrically coupled to the n-doped raised drain structure.

Example 8

The group III-N semiconductor structure of Example 7, wherein the gate dielectric layer is disposed on the n-doped raised drain structure and on the n-doped raised source structure.

Example 9

The group III-N transistor structure of Example 7 or Example 8, further wherein the gate dielectric layer is disposed on the n-doped raised drain structure, on sidewalls of the intrinsic group III-N semiconductor material, and on sidewalls and on an uppermost surface of the p-doped group III-N semiconductor material.

Example 10

The group III-N semiconductor structure of Example 7, wherein the group III-N semiconductor material includes gallium nitride (GaN).

Example 11

The group III-N semiconductor structure of Example 7, wherein the mobility enhancement layer is AlN.

Example 12

The group III-N semiconductor structure of Example 7, wherein the polarization charge inducing layer includes a group III-N semiconductor material that includes aluminum.

Example 13

The group III-N semiconductor structure of Example 7, Example 10, Example 11 or Example 12, wherein the group III-N semiconductor material is GaN, the mobility enhancement layer is AlN, polarization charge inducing layer includes a group III-N semiconductor material that includes aluminum.

Example 14

The group III-N transistor structure of Example 7, wherein the gate electrode comprises a work function layer and a metal cap.

Example 15

The group III-N transistor structure of Example 7, wherein the first electrode and the second electrode comprise one or more layers of metal.

Example 16

The group III-N transistor structure of Example 7, wherein the intrinsic group III-N semiconductor material is i-InGaN, and further wherein the intrinsic group III-N semiconductor material has a thickness ranging between 0-10 nm.

Example 17

The group III-N transistor structure of Example 7, wherein the p-doped group III-N semiconductor material is p-doped GaN.

Example 18

A method of fabricating a P-i-N diode structure, the method includes providing a group III-N semiconductor material on a substrate. The method includes forming an n-doped raised drain structure on the group III-N semiconductor material. The method includes forming an intrinsic group III-N semiconductor material on the n-doped raised drain structure. The method includes forming a p-doped group III-N semiconductor material disposed on the intrinsic group III-N semiconductor material. The method includes forming a first electrode on the p-doped group III-N semiconductor material and forming a second electrode on the n-doped raised drain structure.

Example 19

The method of Example 18, wherein forming the p-doped group III-N semiconductor material, includes p-doping to a concentration of at least $1e17/cm^3$.

Example 20

The method of Example 17 or Example 18, wherein forming the intrinsic group III-N semiconductor material and the p-doped group III-N semiconductor material includes forming the intrinsic group III-N semiconductor material and the p-doped group III-N semiconductor material in an opening in a dielectric layer.

Example 21

A method of fabricating group III-Nitride (III-N) semiconductor structure, the method includes providing a group III-N semiconductor material on a substrate. The method includes forming a mobility enhancement layer on the group III-N semiconductor material. The method includes forming a polarization charge inducing layer on the mobility enhancement layer. The method includes forming an n-doped raised source structure and an n-doped raised drain structure. The method includes forming an intrinsic group III-N semiconductor material on the n-doped raised drain structure. The method includes forming a p-doped group III-N semiconductor material disposed on the intrinsic group III-N semiconductor material. The method includes forming a recess in the polarization charge inducing layer, the recess providing a gap separating a first portion of the polarization charge inducing layer from a second portion of the polarization charge inducing layer. The method includes forming a gate dielectric layer above the mobility enhancement layer in the gap. The method includes forming a first opening in a dielectric layer, the first opening exposing the gate dielectric layer over the gap. The method includes forming a gate electrode in the first opening. The method includes forming a second opening in the dielectric layer, the second opening exposing the p-doped group III-N semiconductor material and forming a second electrode in the second opening on the p-doped group III-N semiconductor material.

Example 22

The method of Example 21, wherein forming the gate dielectric layer includes forming the gate dielectric layer on the raised source structure and on the raised drain structure.

Example 23

The method of Example 21 or Example 22, wherein forming the gate dielectric layer includes forming the gate dielectric layer on the raised source structure, on the raised drain structure, on sidewalls of the intrinsic doped group III-N semiconductor material, and on sidewalls and on an uppermost surface of the p-doped group III-N semiconductor material.

Example 24

The method of Example 21, wherein forming the n-doped raised drain structure, includes doping the raised drain structure with an n-type dopant species to a concentration of at least $1e19/cm^3$.

Example 25

The method of Example 21, wherein forming the gate electrode after forming the intrinsic group III-N semiconductor material and the p-doped group III-N semiconductor material.

What is claimed is:
1. A P-i-N diode structure comprising:
   a group III-nitride (N) semiconductor material disposed on a substrate;
   an n-doped raised drain structure disposed on the group III-N semiconductor material;
   an intrinsic group III-N semiconductor material disposed on the n-doped raised drain structure;
   a p-doped group III-N semiconductor material disposed on the intrinsic group III-N semiconductor material;
   a first electrode connected to the p-doped group III-N semiconductor material; and
   a second electrode electrically coupled to the n-doped raised drain structure.
2. The P-i-N diode structure of claim 1, wherein the group III-N semiconductor material includes gallium nitride (GaN) or indium gallium nitride (InGaN).
3. The P-i-N diode structure of claim 1, wherein the n-doped raised drain structure is InGaN, and further wherein the n-doped raised drain structure is doped to an n-type to concentration of at least 1e19/cm³.

4. The P-i-N diode structure of claim 1, wherein the p-doped group III-N semiconductor material is p-doped GaN or p-doped $In_xGa_{1-x}N$ where $0<x<0.3$.

5. The P-i-N diode structure of claim 1, wherein the intrinsic group III-N semiconductor material is indium gallium nitride (InGaN) and further wherein, the intrinsic group III-N semiconductor material has a thickness between 5 nm-10 nm.

6. The P-i-N diode structure of claim 5, wherein the amount of indium in the intrinsic InGaN layer is greater the amount of indium in the n-doped raised drain structure.

7. A group III-Nitride (III-N) semiconductor structure, comprising:
 a group III-N semiconductor material disposed on a substrate;
 a group III-N transistor structure comprising:
  a raised n-doped raised drain structure disposed on the group III-N semiconductor material;
  a raised n-doped raised source structure disposed on the group III-N semiconductor material;
  a mobility enhancement layer disposed on the group III-N semiconductor material, between the n-doped raised source structure and the n-doped raised drain structure;
  a polarization charge inducing layer disposed above the mobility enhancement layer between the n-doped raised source structure and the n-doped raised drain structure, the polarization charge inducing layer having a first portion and a second portion separated by a gap;
  a gate dielectric layer disposed on the mobility enhancement layer in the gap;
  a gate electrode disposed on the gate dielectric layer above the gap between the n-doped raised drain structure and the n-doped raised source structure;
 a P-i-N diode structure comprising:
  the raised n-doped drain structure disposed on the group III-N semiconductor material;
  an intrinsic group III-N semiconductor material disposed on the n-doped raised drain structure;
  a p-doped group III-N semiconductor material disposed on the intrinsic group III-N semiconductor material;
  a first electrode connected to the p-doped group III-N semiconductor material; and
  a second electrode electrically coupled to the n-doped raised drain structure.

8. The group III-N semiconductor structure of claim 7, wherein the gate dielectric layer is disposed on the n-doped raised drain structure and on the n-doped raised source structure.

9. The group III-N transistor structure of claim 8, further wherein the gate dielectric layer is disposed on the n-doped raised drain structure, on sidewalls of the intrinsic group III-N semiconductor material, and on sidewalls and on an uppermost surface of the p-doped group III-N semiconductor material.

10. The group III-N semiconductor structure of claim 7, wherein the group III-N semiconductor material includes gallium nitride (GaN) or indium gallium nitride (InGaN).

11. The group III-N semiconductor structure of claim 7, wherein the mobility enhancement layer is AlN.

12. The group III-N semiconductor structure of claim 7, wherein the polarization charge inducing layer includes a group III-N semiconductor material that includes aluminum.

13. The group III-N semiconductor structure of claim 7, wherein the group III-N semiconductor material is GaN, the mobility enhancement layer is AlN, polarization charge inducing layer is a group III-N semiconductor material that includes aluminum.

14. The group III-N transistor structure of claim 7, wherein the gate electrode comprises a work function layer and a metal cap.

15. The group III-N transistor structure of claim 7, wherein the first electrode and the second electrode comprise one or more layers of metal.

16. The group III-N transistor structure of claim 7, wherein the intrinsic group III-N semiconductor material is i-InGaN, and further wherein the intrinsic group III-N semiconductor material has a thickness between 5 nm-10 nm.

17. The group III-N transistor structure of claim 7, wherein the p-doped group III-N semiconductor material is p-doped GaN or p-doped $In_xGa_{1-x}N$ where $0<x<0.3$.

18. A method of fabricating a P-i-N diode structure, the method comprising:
 providing a group III-N semiconductor material on a substrate;
 forming an n-doped raised drain structure on the group III-N semiconductor material;
 forming an intrinsic group III-N semiconductor material on the n-doped raised drain structure;
 forming a p-doped group III-N semiconductor material disposed on the intrinsic group III-N semiconductor material;
 forming a first electrode on the p-doped group III-N semiconductor material; and
 forming a second electrode on the n-doped raised drain structure.

19. The method of claim 18, wherein the p-doped group III-N semiconductor material is p-doped to a concentration of at least 1e17/cm³.

20. The method of claim 18, wherein forming the intrinsic group III-N semiconductor material and the p-doped group III-N semiconductor material includes forming the intrinsic group III-N semiconductor material and the p-doped group III-N semiconductor material in an opening in a dielectric layer.

21. A method of fabricating group III-Nitride (III-N) semiconductor structure, the method comprising:
 providing a group III-N semiconductor material on a substrate;
 forming a mobility enhancement layer on the group III-N semiconductor material;
 forming a polarization charge inducing layer on the mobility enhancement layer;
 forming an n-doped raised source structure and an n-doped raised drain structure;
 forming an intrinsic group III-N semiconductor material on the n-doped raised drain structure;
 forming a p-doped group III-N semiconductor material disposed on the intrinsic group III-N semiconductor material;
 forming a recess in the polarization charge inducing layer, the recess providing a gap separating a first portion of the polarization charge inducing layer from a second portion of the polarization charge inducing layer;
 forming a gate dielectric layer above the mobility enhancement layer in the gap;
 forming a gate electrode on the gate dielectric layer;
 forming a first electrode on the n-doped raised drain region; and forming a second electrode on the p-doped group III-N semiconductor material.

22. The method of claim 21, wherein forming the gate dielectric layer includes forming the gate dielectric layer on the raised source structure and on the raised drain structure.

23. The method of claim 21, wherein forming the gate dielectric layer includes forming the gate dielectric layer on the raised source structure, on the raised drain structure, on sidewalls of the intrinsic doped group III-N semiconductor material, and on sidewalls and on an uppermost surface of the p-doped group III-N semiconductor material.

24. The method of claim 21, wherein the n-doped raised drain structure is doped to concentration of at least $1e19/cm^3$.

25. The method of claim 21, wherein the forming of the gate electrode occurs after the forming of the intrinsic group III-N semiconductor material and of the p-doped group III-N semiconductor material.

* * * * *